(12) United States Patent
Yamazaki et al.

(10) Patent No.: US 6,730,932 B2
(45) Date of Patent: *May 4, 2004

(54) SEMICONDUCTOR DEVICE AND METHOD OF MANUFACTURING THE SAME

(75) Inventors: Shunpei Yamazaki, Tokyo (JP); Hisashi Ohtani, Kanagawa (JP)

(73) Assignee: Semiconductor Energy Laboratory, Co. Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/107,113

(22) Filed: Mar. 26, 2002

(65) Prior Publication Data

US 2002/0117736 A1 Aug. 29, 2002

Related U.S. Application Data

(63) Continuation of application No. 09/006,844, filed on Jan. 14, 1998, now Pat. No. 6,380,560.

(30) Foreign Application Priority Data

Jan. 20, 1997 (JP) ............................................. 9-022077
Apr. 26, 1997 (JP) ............................................. 9-123088

(51) Int. Cl.[7] .................. H01L 27/04; H01L 31/20; H01L 31/036; H01L 31/0376
(52) U.S. Cl. .................. 257/72; 257/59; 257/290; 257/291; 257/292
(58) Field of Search ....................... 257/59–72, 290–292

(56) References Cited

U.S. PATENT DOCUMENTS

| 5,170,244 A | * | 12/1992 | Dohjo et al. | 257/72 |
| 5,250,931 A | * | 10/1993 | Misawa et al. | 345/206 |
| 5,525,822 A | * | 6/1996 | Vinal | 257/344 |
| 5,744,824 A | | 4/1998 | Kousai et al. | 257/59 |
| 5,780,872 A | * | 7/1998 | Misawa et al. | 257/72 |
| 5,796,150 A | * | 8/1998 | Wuu et al. | 257/401 |
| 5,818,070 A | * | 10/1998 | Yamazaki et al. | 257/72 |
| 5,821,138 A | * | 10/1998 | Yamazaki et al. | 438/166 |
| 5,821,622 A | * | 10/1998 | Tsuji et al. | 257/763 |
| 5,859,443 A | * | 1/1999 | Yamazaki et al. | 257/65 |
| 5,864,150 A | * | 1/1999 | Lin | 257/61 |
| 5,929,464 A | * | 7/1999 | Yamazaki et al. | 257/72 |
| 5,942,768 A | | 8/1999 | Zhang | 257/59 |
| 6,147,667 A | | 11/2000 | Yamazaki et al. | 257/92 |
| 6,211,536 B1 | | 4/2001 | Zhang | 257/72 |
| 6,380,560 B1 | * | 4/2002 | Yamazaki et al. | 257/72 |
| 2001/0018224 A1 | | 8/2001 | Zhang | 257/72 |

FOREIGN PATENT DOCUMENTS

| CN | 1118521 | 3/1996 | 257/290 |
| JP | 07-135318 | 5/1995 | 257/72 |
| JP | 08-078329 | 3/1996 | 257/72 |
| JP | 08 213634 | 8/1996 | 257/291 |
| JP | 08 288522 | 11/1996 | 257/292 |
| JP | 09-022077 | 1/1997 | 257/72 |
| JP | 09-312260 | 12/1997 | 257/72 |
| JP | 10-270363 | 10/1998 | 257/72 |

OTHER PUBLICATIONS

Kuznetsov, et al., "Silicide precipitate formation and solid phase regrowth on Ni–30 –implanted amorphous silicon", Inst. Phys. Conf. Ser. No. 134:Section 4, Paper presented at Mocrosc. Semicond. Mater. Conf., Apr. 1993, pp. 191–194.
Kuznetsov, et al., "Transient Kinetics in solid phase cpitaxy of Ni doped amorphous silicon", Nuclear Instruments & Methods in Physics Research, B 96, 1995, pp. 261–264.

* cited by examiner

Primary Examiner—B. William Baumeister
Assistant Examiner—Jesse A. Fenty
(74) Attorney, Agent, or Firm—Fish & Richardson P.C.

(57) ABSTRACT

A semiconductor device includes TFTs designed in accordance with characteristics of circuits. In a first structure of the invention, the TFT is formed by using a crystalline silicon film made of a unique crystal structure body. The crystal structure body has a structure in which rod-like or flattened rod-like crystals grow in a direction parallel to each other. In a second structure of the invention, growth distances of lateral growth regions are made different from each other in accordance with channel lengths of the TFTs. By this, characteristics of TFTs formed in one lateral growth region can be made as uniform as possible.

20 Claims, 27 Drawing Sheets

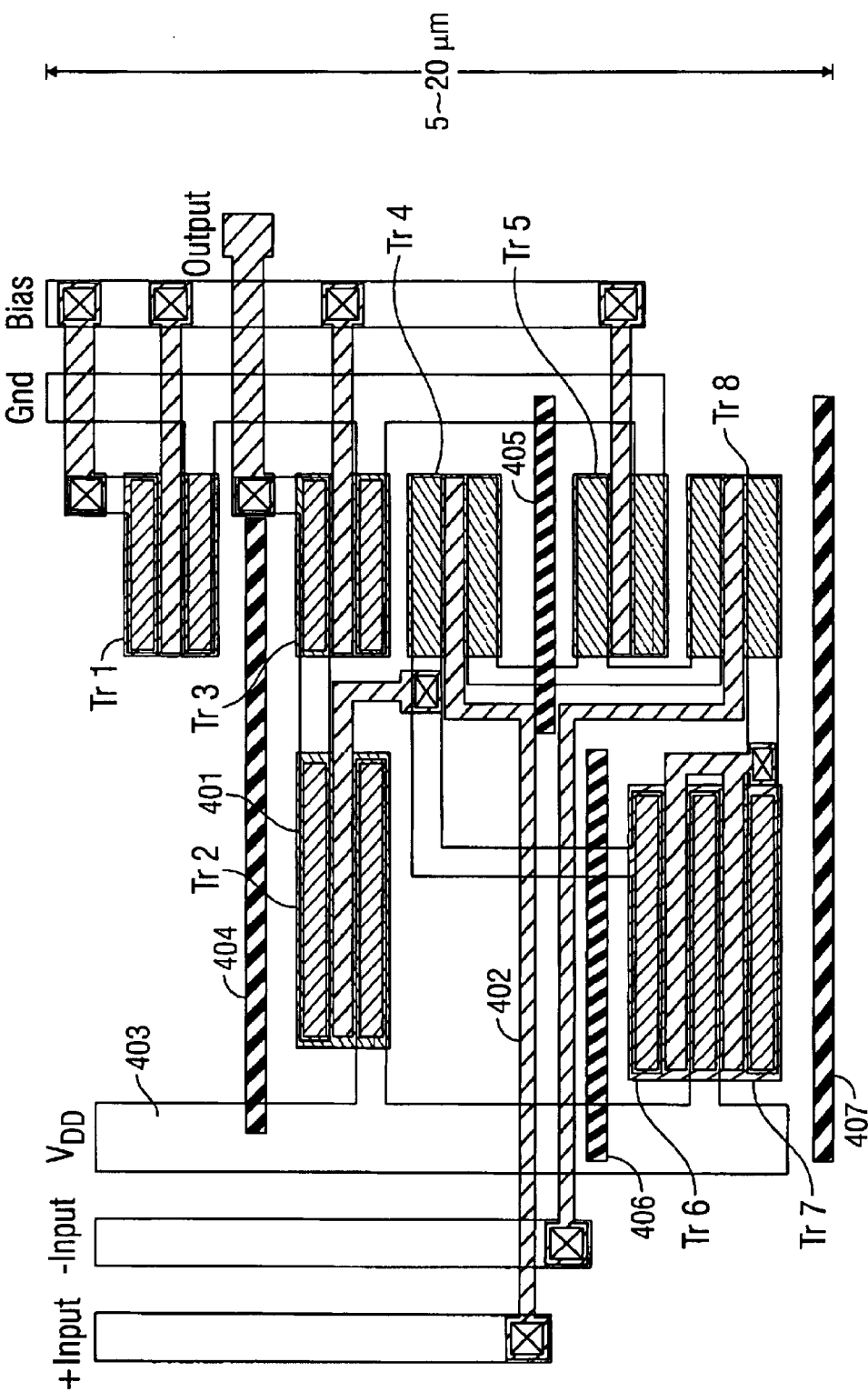

**Addition of Impurity Ion for Giving N-Type
(Formation of n⁻ Region)**

**Addition of Impurity Ion for Giving P-Type
(Formation of p⁻ Region)**

**Addition of Impurity Ion for Giving N-Type
(Formation of n⁺ Region)**

Addition of Impurity Ion for Giving P-Type (Formation of p+ Region)

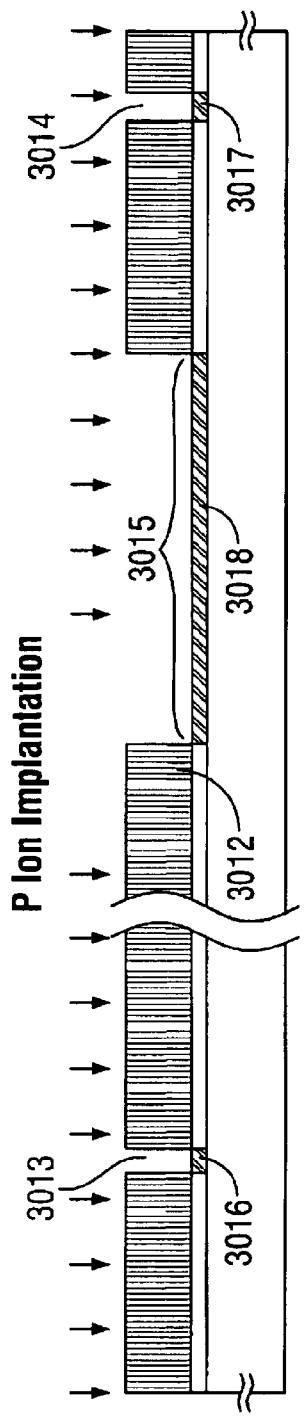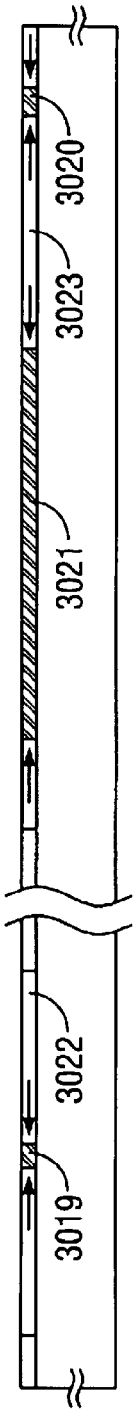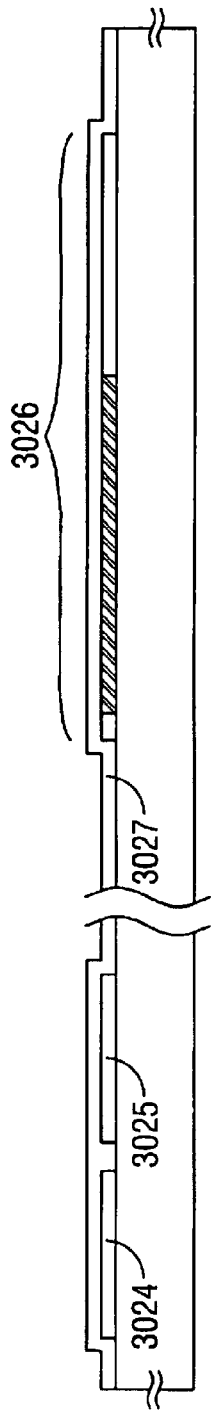

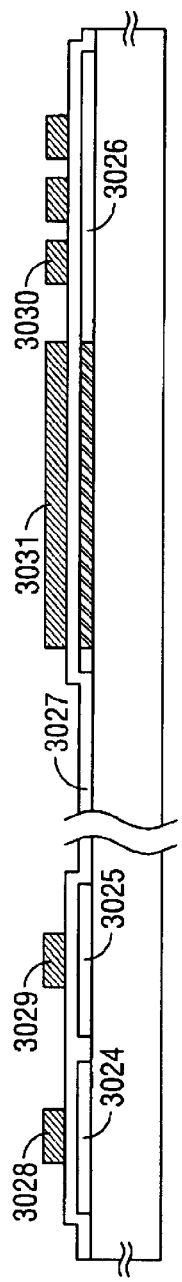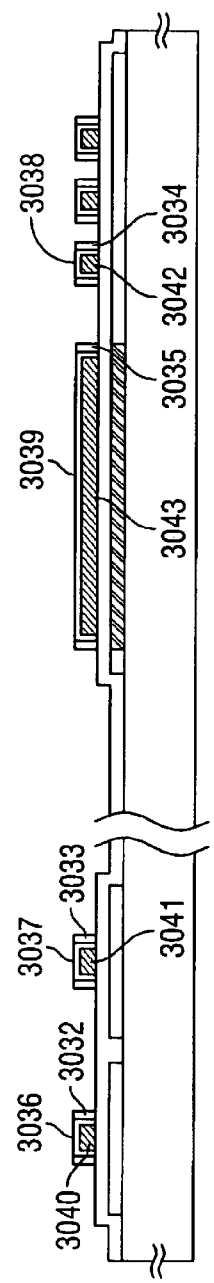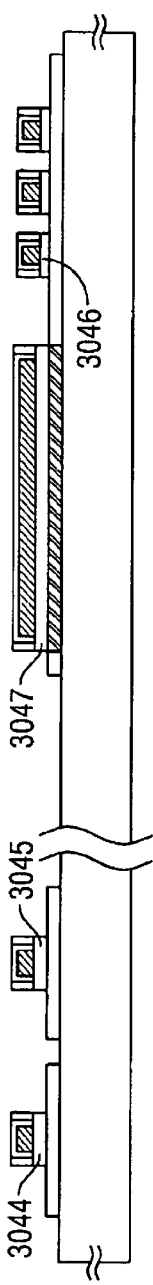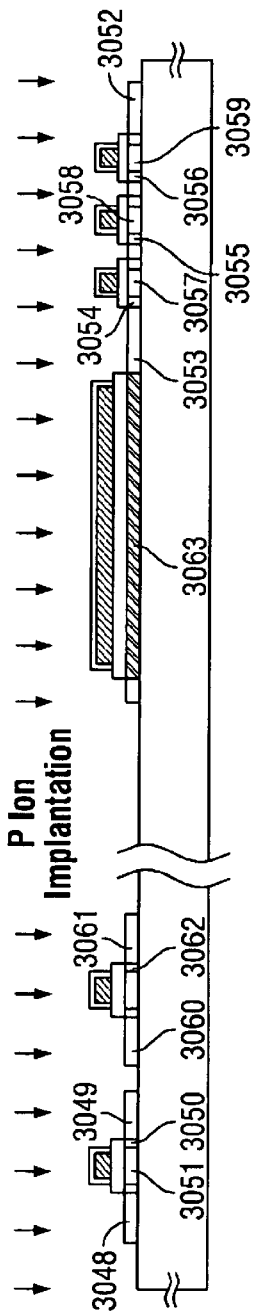
FIG. 20A
FIG. 20B
FIG. 20C
FIG. 20D

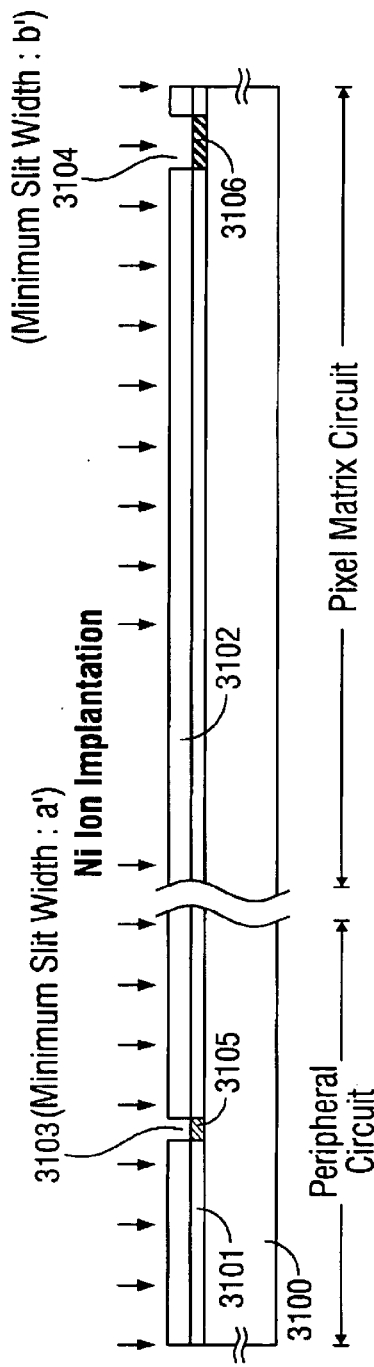
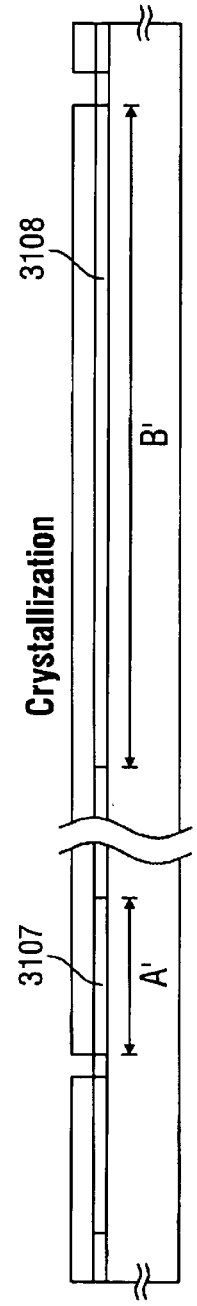
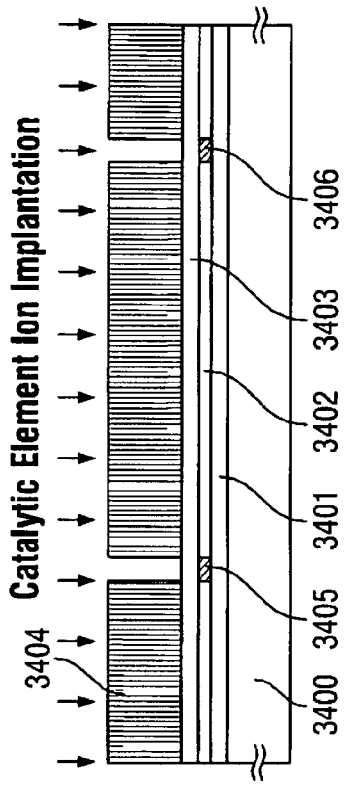
FIG. 22A
FIG. 22B
FIG. 23

Gettering by Halogen Element

SEMICONDUCTOR DEVICE AND METHOD OF MANUFACTURING THE SAME

This application is a continuation of U.S. application Ser. No. 09/006,844, filed Jan. 14, 1998 now U.S. Pat. No. 6,380,560.

BACKGROUND OF THE INVENTION

1. Field of the Invention

The present invention relates to a semiconductor device constituted by thin film transistors (TFT) formed on a substrate having an insulating surface and a method of manufacturing the same. Such a semiconductor device includes an IC, an LSI, an electrooptical device and the like, and especially it is effective to apply the present invention to the electrooptical device.

2. Description of the Related Art

In recent years, research in a semiconductor device constituted by TFTs using polycrystalline silicon thin films (polysilicon film: p-Si film) instead of TFTs using noncrystalline silicon thin films (amorphous silicon film: a-Si film), is developed. Especially, development and research in an active matrix type display device in which semiconductor devices are integrated on a substrate, is remarkable, since the demand as a display device of a PC monitor, a video camera, a projection or the like has been increased.

As such an active matrix type display device, there is known one disclosed in U.S. Pat. No. 5,250,931 (Misawa et al.). However, additional values are recently required, and there has been proposed an SOP (System On Panel) plan in which a logic circuit (signal processing circuit such as a display control circuit and an arithmetic circuit), which are conventionally realized by an externally equipped IC, is mounted on the same substrate by TFTs.

Also, research for manufacturing a conventional IC or VLSI itself by TFTs, is made to proceed. It is because a TFT is formed on an insulating substrate so that it has a feature that parasitic capacitance is extremely small, and it can be said that the TFT is more effective in high speed operation than an FET formed on single crystal silicon.

However, a technique for forming a TFT which is capable of realizing the plan has not been established. The reason is that when a presently used polysilicon film (including a so-called high temperature polysilicon and low temperature polysilicon film) is employed, it is difficult to obtain a TFT having enough performance to constitute a circuit requiring high frequency driving.

Although the improvement of an operation speed of a TFT can be made for the time being by decreasing the size of the TFT, the reduction of the channel length (or gate length) results in the short channel effect, so that disadvantages such as lowering of a drain withstand voltage is caused. Thus, in the TFT using a conventional silicon thin film, the improvement of an operation speed by the scaling law reaches the limits, and it is difficult to increase the operation speed any more in view of reliability. Further, the silicon thin film has a problem that crystal grains and crystal grain boundaries exist irregularly, and the crystal grain boundaries greatly influence the TFT characteristics to cause irregularity.

SUMMARY OF THE INVENTION

An object of the present invention is to overcome the above described problems to provide a semiconductor device constituted by TFTs formed on a substrate having an insulating surface, and a method of manufacturing the same.

Especially, an object of the present invention is to provide an electrooptical device (hereinafter referred to as a system display) carrying a logic circuit constituted by TFTs and functionally systematized, and a method of manufacturing the same.

Incidentally, the semiconductor device includes all devices using a semiconductor to function, and all of an IGFET, a TFT, an IC, an electrooptical device and an applied product thereof are included in the category of the semiconductor device in a wide sense.

According to an aspect of the present invention, in an electrooptical device constituted by disposing a pixel matrix circuit, a driver circuit and a logic circuit on the same substrate, the pixel matrix circuit, the direr circuit and the logic circuit include a plurality of TFTs each having an active layer of a crystalline silicon film and a subthreshold coefficient of 60 to 100 mV/decade, and channel formation regions of the plurality of TFTs included in the respective circuits are made of lateral growth regions having growth distances different from each other according to characteristics required by the respective circuits.

According to another aspect of the present invention, in an electrooptical device constituted by disposing a pixel matrix circuit, a driver circuit and a logic circuit on the same substrate, the pixel matrix circuit, the direr circuit and the logic circuit includes a plurality of TFTs each having an active layer of a crystalline silicon film and a subthreshold coefficient of 60 to 100 mV/decade, channel formation regions of the plurality of TFTs included in the respective circuits are made of lateral growth regions having growth distances different from each other according to characteristics required by the respective circuits, and the growth distances of the lateral growth regions which become the channel formation regions of the TFTs constituting the logic circuit and/or the driver circuit, are shorter than the growth distances of the lateral growth regions which become the channel formation regions of the TFTs constituting the pixel matrix circuit.

According to still another aspect of the present invention, in an electrooptical device constituted by disposing a pixel matrix circuit, a driver circuit and a logic circuit on the same substrate, the pixel matrix circuit, the direr circuit and the logic circuit include a plurality of TFTs each having an active layer of a crystalline silicon film and a subthreshold coefficient of 60 to 100 mV/decade, channel formation regions of the plurality of TFTs included in the respective circuits are made of lateral growth regions having growth distances different from each other according to characteristics required by the respective circuit, and channel lengths of the plurality of TFTs correlates with the growth distances of the lateral growth regions.

According to still another aspect of the present invention, in an electrooptical device constituted by disposing a pixel matrix circuit, a driver circuit and a logic circuit on the same substrate, the pixel matrix circuit, the direr circuit and the logic circuit includes a plurality of TFTs each having an active layer of a crystalline silicon film and a subthreshold coefficient of 60 to 100 mV/decade, at least channel formation regions of the plurality of TFTs included in the respective circuits are made of a plurality of stripe-shaped crystalline regions, and respective atoms in the plurality of crystalline regions are continuously disposed without forming lattice defects in all or substantially all boundaries of adjacent crystalline regions in the inside of the plurality of stripe-shaped crystalline regions.

According to still another aspect of the present invention, in a method of manufacturing an electrooptical device comprising the steps of: forming an amorphous silicon film on a substrate having an insulating surface; selectively adding a catalytic element for promoting crystallization of the silicon film to the amorphous silicon film; forming a lateral growth region made of a crystalline silicon film by crystallizing the amorphous silicon film from the starting point of an added region of the catalytic element through heat treatment; forming an active layer in which at least a channel formation region is made of only the lateral growth region; forming a silicon oxide film on the active layer; and carrying out a heat treatment in an atmosphere containing a halogen element to remove the catalytic element in the active layer and to make thermal oxidation of the active layer, the step of adding the catalytic element is carried out by an ion implantation method or a plasma doping method, and at least one portion on the same substrate is added with the catalytic element with a concentration different from that of the catalytic element added to the other region.

According to still another aspect of the present invention, in a method of manufacturing an electrooptical device comprising the steps of: forming an amorphous silicon film on a substrate having an insulating surface; selectively adding a catalytic element for promoting crystallization of the silicon film to the amorphous silicon film; forming a lateral growth region made of a crystalline silicon film by crystallizing the amorphous silicon film from the starting point of an added region of the catalytic element through a heat treatment; forming an active layer in which at least a channel formation region is made of only the lateral growth region; forming a silicon oxide film on the active layer; and carrying out a heat treatment in an atmosphere containing a halogen element to remove the catalytic element in the active layer and to carry out thermal oxidation of the active layer, the step of adding the catalytic element is carried out by an ion implantation method or a plasma doping method, and the catalytic element with different concentration according to a channel length of the active layer is added to the same substrate.

BRIEF DESCRIPTION OF THE DRAWINGS

FIGS. 4A and 4B are views showing the structure of an operational amplifier and the circuit construction.

FIGS. 19A to 19C are views showing manufacturing steps of a semiconductor device.

FIGS. 20A to 20D are views showing manufacturing steps of a semiconductor device.

FIGS. 22A and 22B are views showing manufacturing steps of a semiconductor device.

FIG. 23 is a view showing an ion implantation step.

DETAILED DESCRIPTION OF THE INVENTION (Embodiment 1)

Figure 1:
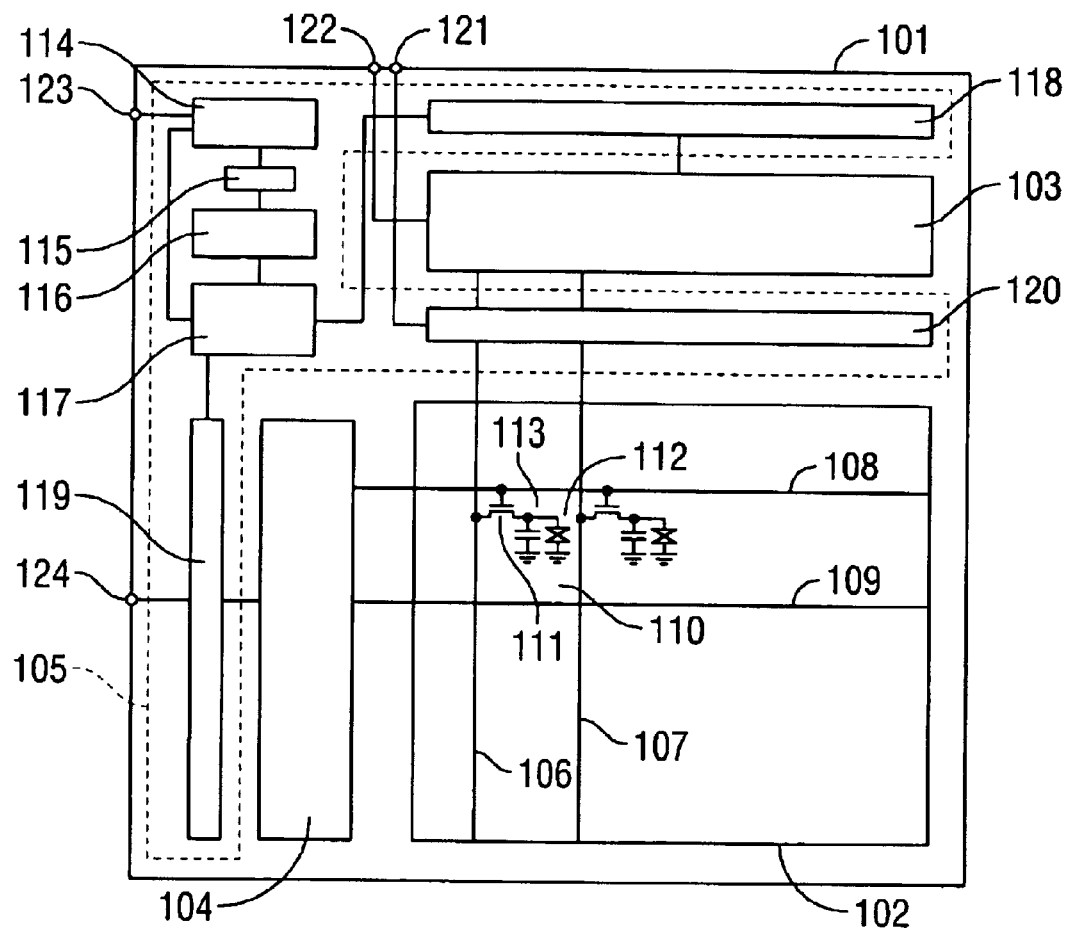
FIG. 1 is a top view showing a system display.

FIG. 1 is a block diagram of a system display which is an example of a semiconductor device according to the present invention. The system display of the present invention is constituted such that a pixel matrix circuit 102, a source line driver circuit 103, a gate line driver circuit 104, and a logic circuit 105 are integrally formed on a substrate 101. In this embodiment, an active matrix type liquid crystal display device is exemplified.

Incidentally, the circuit structure shown in this embodiment is merely one example, and the circuit structure of the present invention is not limited thereto. The gist of the present invention is that the logic circuit 105 is mounted on the same substrate, and the structures of various circuits including the pixel matrix circuit 102, the source line driver circuit 103, the gate line driver circuit 104, and the logic circuit 105 may be determined according to the necessity of circuit design.

In FIG. 1, the source line driver circuit 103 is mainly constituted by a shift register, a level shifter, a buffer, a latch circuit and the like. The gate line driver circuit 104 is mainly constituted by a shift register, a multiplexer, a level shifter, a buffer, and the like. Of course, the shift register may be substituted by a circuit having the same function, such as a counter and a decoder. Although FIG. 1 shows a circuit structure for a digital operation, if the system display is designed for an analog operation, the source line driver circuit 103 includes a sample-and-hold circuit and the like.

Various circuits included in the source line driver circuit 103 and the gate line driver circuit 104 are constituted by, as a basic unit, an inverter circuit of a CMOS structure in which an N-channel TFT and a P-channel TFT are complementarily combined with each other. Of course, although a single polarity circuit may be used, a static type or a dynamic type circuit of the CMOS structure is suitable in view of low consumption of electric power.

The pixel matrix circuit 102 is constituted by a plurality of pixel regions 110 arranged in matrix, which are surrounded by a plurality of source lines 106 and 107 connected to the source line driver circuit 103 and a plurality of gate lines 108 and 109 connected to the gate line driver circuit 104. Each of the plurality of pixel regions 110 include a pixel TFT 111, a liquid crystal cell 112, and an auxiliary capacitance 113. Although not shown, the liquid crystal cell 112 is constituted by a pixel electrode, an opposite electrode, and a liquid crystal held therebetween.

The logic circuit 105 indicates all circuits required to carry out signal processing necessary for image display, such as processing of a start pulse, a clock signal and the like for driving the source line driver circuit 103 and the gate line driver circuit 104, or processing of a video signal for making the pixel matrix circuit 102 carry out the image display.

In the embodiment shown in FIG. 1, the logic circuit 105 includes a phase comparator 114, a LPF (Low Pass Filter) 115, a VCO (Voltage Controlled Oscillator) 116, a frequency divider 117, an oscillator 118 for a source line driver (for horizontal scanning), an oscillator 119 for a gate line driver (for vertical scanning), and a D/A converter (digital-to-analog converter) 120.

The present inventors consider that it is possible to realize a system display having a function of a CPU (Central Processing Unit) by monolithically mounting other not-shown logic circuits, for example, an I/O port for inputting and outputting signals transmitted from an image sensor or CCD, amplifying circuits (differential amplifier, operational amplifier, comparator, etc.), an A/D converter, a memory (RAM, ROM, etc.) for storing data, and ultimately an arithmetic circuit.

Reference numeral 121 denotes an input terminal for an analog signal in accordance with a digital tone signal, 122 denotes an input terminal of a bit signal for selecting the digital tone signal, 123 denotes an input terminal of a horizontal scanning synchronous signal, and 124 denotes an input terminal of a vertical scanning synchronous signal. Of course, if an oscillation circuit for generating the analog signal, bit signal and synchronous signal is integrated on the substrate, the input terminals are not necessary.

Since such a system display is manufactured by TFTs on a substrate having an insulating surface, it has an advantage that parasitic capacitance is smaller than a conventional FET manufactured on single crystal silicon. This is preferable in view of increasing an operation speed of a TFT. Further, since an island-like semiconductor layer using a silicon thin film is made an active layer, separation between elements is easy and control of concentration of phosphorus or boron added to the active layer is simple.

First Structure of the Present Invention

In order to realize the system display shown in FIG. 1, it is indispensable to use a TFT using a crystalline silicon film made of a unique crystal structure body invented by the present inventors. Then the features of the unique crystal structure body and the features of a TFT constituted by the same, will be described below.

(Features of the Unique Crystal Structure Body)

Figure 8:
FIG. 8 is a photograph for explaining a unique crystalline structure.

FIG. 8 is a TEM photograph of a crystalline silicon film of the unique crystal structure body, which is magnified by a factor of 250 thousands. As shown in FIG. 8, the crystalline silicon film obtained by the present inventors has the following features.

(1) The structure of crystal lattices is such that the lattices are continuously connected to each other in an almost specific direction.

(2) Thin rod-shaped (or column-shaped) crystals or thin flattened rod-shaped crystals grow.

(3) The plurality of rod-shaped or flattened rod-shaped crystals grow parallel or substantially parallel to each other, and in a direction.

When seeing the photograph shown in FIG. 8, it is confirmed that for example, a rod-shaped crystal with a narrow width of about 0.15 $\mu$m extends in the oblique direction from the lower left to the upper right, and definite boundaries (crystal grain boundaries) exist at both ends of the crystal in the width direction (shades of lines and the like seen in the photograph are due to the difference of directions of crystal faces). Also, it is confirmed that since a plurality of rod-shaped crystals grow in the direction substantially parallel to each other, a plurality of crystal grain boundaries also extend substantially in parallel. Since these crystal grain boundaries become energy barriers for a carrier (electron or hole), it is conceivable that the carrier moves in only the inside of the rod-shaped crystal with priority.

As described later in detail, the crystallinity of the crystal structure body is extremely improved by a heat treatment at a temperature exceeding 700° C. in an atmosphere containing a halogen element, and a catalytic element is removed by gettering so that the catalytic element does not cause any problem. Thus, it is conceivable that crystal lattices are continuously connected to each other in the inside of the rod-shaped crystal and the inside has become a region regarded as substantially a single crystal for a carrier. Thus, it is also one feature that there is scarcely any impurity scattering for blocking the movement of the carrier.

When an active layer of a TFT is formed, the mobility of a carrier is greatly improved by designing such that the direction of movement of the carrier coincides with the direction of extension of the crystal grain boundaries. This is because the directions of movements of carriers are regulated by the crystal grain boundaries into one specific direction so that scattering due to collision among carriers is extremely lessened. Like this, in the case where the crystalline silicon film made of the unique crystal structure body is made an active layer, it may be said that the active layer has anisotropy for the behavior of carriers.

Also, it is possible to give a feature of the unique crystal structure body that lattices are continuously connected to each other at the crystal grain boundaries (boundary) of the rod-shaped or flattened rod-shaped crystals. The state will be described with reference to FIGS. 17A to 17D.

Figure 17A:
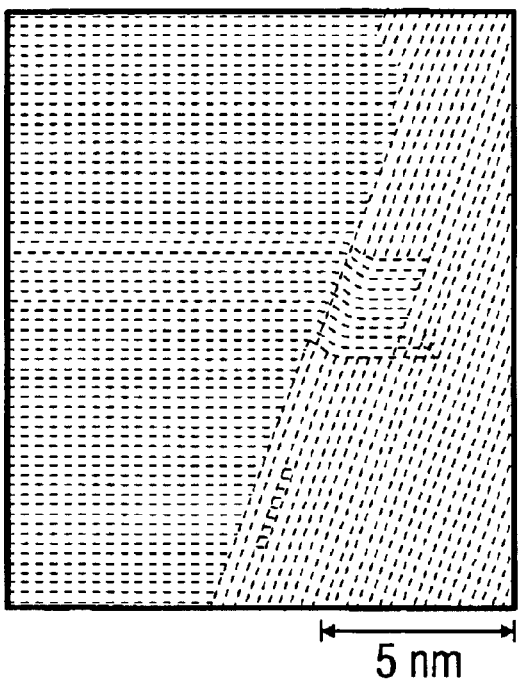
FIGS. 17A to 17D are photographs and schematic views for explaining the lattice state of crystal grain boundaries.

FIG. 17A is an HRTEM (High Resolution TEM) photograph showing magnified crystal grain boundaries of rod-shaped or flattened rod-shaped crystals in the crystalline silicon film made of the unique crystal structure body. The analysis through the HRTEM is used for observing a lattice image of crystal. The present inventors have obtained the following findings as a result of the observation of lattice images at the crystal grain boundaries.

Figure 17B:
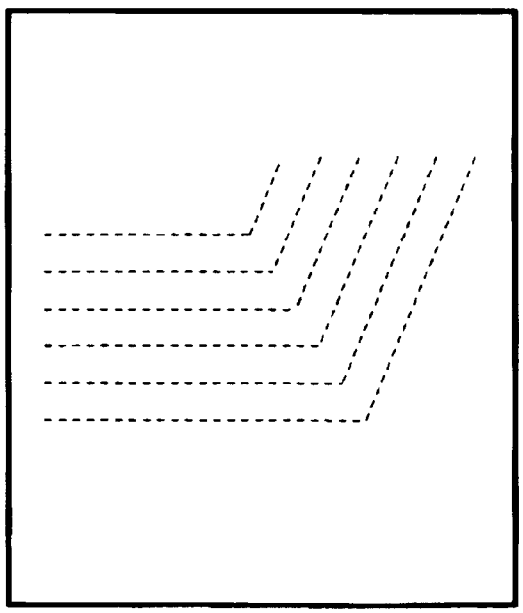

In the HRTEM photograph shown in FIG. 17A, it is confirmed that at the boundaries (crystal grain boundaries) seen at the center of the photograph from top to bottom, adjacent crystal regions are properly and continuously connected to each other. FIG. 17B shows schematically and simply the structure shown in FIG. 17A. As shown in FIG. 17B, although the lattice images with different directions collide with each other at the crystal grain boundaries, the drawing means that since atoms constituting the different crystal regions correspond to each other respectively at the boundaries, lattice defects such as unpaired bond (dangling bond) are not formed.

The crystalline silicon film is made of a plurality of grouped rod-shaped or flattened rod-shaped crystals, and it is conceivable that in all or substantially all crystal grain boundaries, the structure as shown in FIG. 17A is formed. Here, the words "substantially all" mean that even if dangling bonds of silicon atoms exist, the portions are neutralized (terminated) by hydrogen or halogen elements so that the portions do not become lattice defects.

Figure 17C:
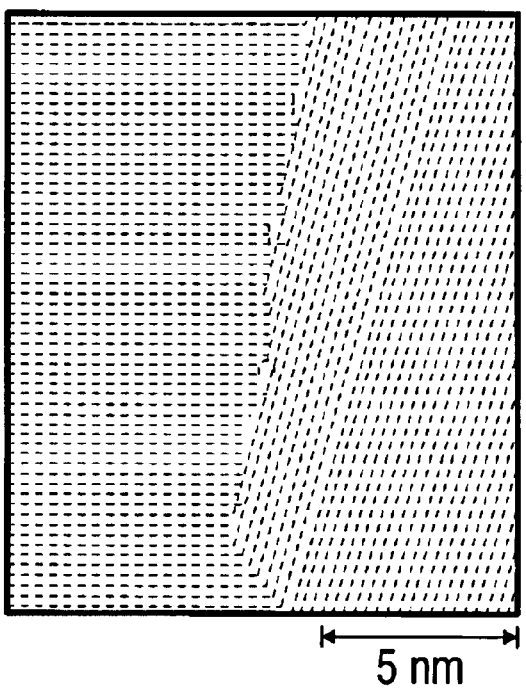
Figure 17D:
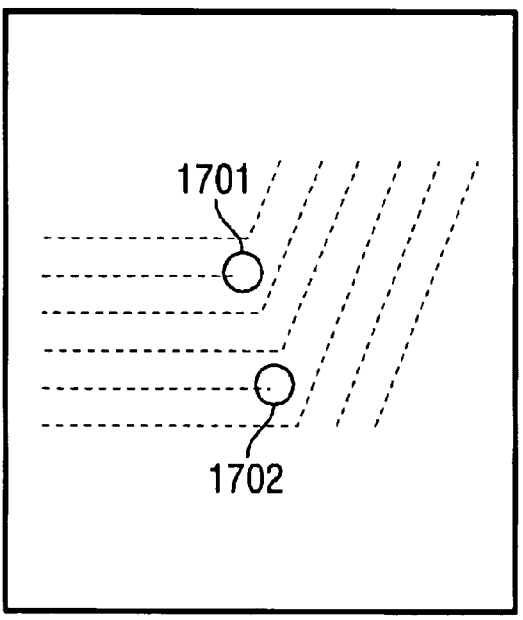

On the other hand, for reference, an HRTEM photograph of a crystalline silicon film (film referred to as a so-called high temperature polysilicon) made of another crystal structure body is shown in FIG. 17C. FIG. 17D is a schematic view thereof. In FIG. 17C, it is confirmed that at the crystal grain boundaries seen at the center of the photograph, lattice images of the left crystal regions are disorderly connected to the lattice images of the right crystal regions. That is, as shown in FIG. 17D, since atoms do not correspond to each other respectively, surplus bonds exist as dangling bonds 1701 and 1702. Thus, there are many traps for carriers at the crystal grain boundaries.

As described above, the crystal silicon film made of the unique crystal structure body according to the present invention has the connective structure quite different from the conventional crystalline silicon film, so that the silicon film has a feature that although it has the crystal grain boundaries, they do not become the recombination centers of carriers.

(Features of a TFT Using the Unique Crystal Structure Body)

The electrical characteristics of a TFT having an active layer of a crystalline silicon film made of the above-mentioned crystal structure body were measured by a commercially available transistor characteristic measuring device (made by Hewlett Packard: model number 4145B). As a result, the following results were obtained.

(1) A subthreshold coefficient as a parameter showing switching performance (promptness of changing of on/off operation) of a TFT was small to be 60 to 100 mV/decade (typically 60 to 85 mV/decade) for both an N-type TFT and a P-type TFT. The data value is almost equal to that of an insulated gate field effect transistor (IGFET) using single crystal silicon.

(2) A field effect mobility ($\mu_{FE}$) as a parameter indicating the speed of operation of a TFT was large to be 200 to 650 cm$^2$/Vs (typically 250 to 300 cm$^2$/Vs) for an N-type TFT and 100 to 300 cm$^2$/Vs (typically 150 to 200 cm$^2$/Vs) for a P-type TFT. This means that the TFT of the present invention has an operation speed more than three times that of a conventional TFT.

(3) A threshold voltage ($V_{th}$) as a parameter showing a standard of a driving voltage of a TFT was small to be −0.5 to 1.5 V for an N-type TFT, and −1.5 to 0.5 V for a P-type TFT. This means that the TFT of the present invention can be driven by a small source voltage so that consumption of electric power can be made small.

As described above, the TFT constituted by the above-mentioned crystal structure body has extremely superior switching characteristics and high speed operation characteristics. Also, the TFT has a feature that due to the unique crystal structure body, it is hardly influenced by a short channel effect. This feature will be described below.

Conventionally, the size of a device has been reduced in accordance with the scaling law in the field of an IC, and the integration of a circuit and improvement of characteristics of a device element have been attempted. However, in a submicron region in which a channel length (distance in a channel formation region in the direction in which a carrier moves) is less than 1 $\mu$m, the short channel effect becomes tangible, so that the improvement of characteristics of an element reaches the limit. The details of the short channel effect may be referred to "PHYSICS OF VLSI DEVICE; Mitsumasa Koyanagi et al; Maruzen; 1986".

For example, when the short channel effect occurs, a drain withstand voltage is lowered and deterioration of an element becomes remarkable. Thus, the short channel effect has been suppressed by a method such as a channel doping method. However, in this case, impurities uniformly added in a channel formation region block the movement of carriers to lower the operation speed of a transistor.

On the other hand, even when a channel length is short to be 0.6 $\mu$m, it is confirmed that a TFT made of the unique crystal structure body has an extremely high operation speed and high drain withstand voltage at the same time, and is a highly reliable TFT by estimation of an accelerating test.

The present inventors infer that the drain withstand voltage of the TFT made of the unique crystal structure body, is high because the crystal grain boundaries effectively function. That is, in the channel formation region, the energy barrier produced by crystal grain boundaries extending substantially in parallel to the channel length direction (defined as a direction in which a carrier moves from a source to a drain), effectively suppresses the extension of a depletion layer from the drain region, and effectively suppresses the lowering of the drain withstand voltage due to a punch-through.

That is, it is conceivable that even in such a state that the influence of the short channel effect become tangible in a TFT using a conventional silicon thin film, that is, even in a submicron (0.01 to 2 $\mu$m) region, the extension of a depletion layer can be suppressed by the unique crystal structure body, so that the short channel effect can be effectively suppressed.

Also, since the short channel effect can be suppressed without carrying out the artificial method (channel doping method or the like) as described above, it is possible to use an intrinsic or substantially intrinsic semiconductor film as a channel formation region. This is one of the most important elements for increasing the operation speed of a TFT.

Incidentally, that the region is intrinsic or substantially intrinsic means to satisfy at least one of the following conditions.

(1) An activation energy of a silicon film is about ½ (Fermi level is positioned at almost the center of a forbidden band).

(2) An impurity concentration in the region is lower than a spin density.

(3) It is an undoped or an intrinsic region in which an impurity is not intentionally added.

Also, since the extension of the depletion layer at the drain side is effectively suppressed by the crystal grain boundaries as described above, the depletion layer capacitance is greatly reduced. Here, the above subthreshold coefficient S is expressed by the following approximate equation.

$$S \partial \ln 10 \cdot kT/q[1+(Cd+Cit)/Cox]$$

Here, k is the Boltzman constant, T is the absolute temperature, q is an amount of charge, Cd is depletion layer capacitance, Cit is equivalent capacitance of an interfacial level, and Cox is gate oxidation film capacitance.

It is conceivable that the fact that the TFT made of the unique crystal structure body has an extremely small subthreshold coefficient as described above, and the fact that the interfacial level is extremely small (the reason will be described in embodiments), support the correctness of the above inference that the depletion layer capacitance Cd is small.

The above is merely an inference obtained by connecting the crystalline silicon film made of the unique crystal structure body actually obtained by the present inventors with the electrical characteristics of the TFT actually experimentally produced by using the same. However, the experimental data is a fact and it is also a fact that the TFT of the present invention has superior performance quite different from a TFT using a conventional silicon thin film.

(Features of a Circuit Constituted by the above TFT)

Frequency characteristics of a ring oscillator fabricated by using TFTs made of the above unique crystal structure body by the present inventors will be described. The ring oscillator is a circuit in which an odd number of stages of inverter circuits each made of a CMOS structure are connected in a ring shape, and is used for obtaining a delay time for one stage of an inverter circuit. The structure of the ring oscillator used for the experiment is as follows.

Number of stages: nine stages.

Film thickness of a gate insulating film of a TFT: 30 nm and 50 nm.

Gate length of a TFT: 0.6 $\mu$m.

Figure 9:
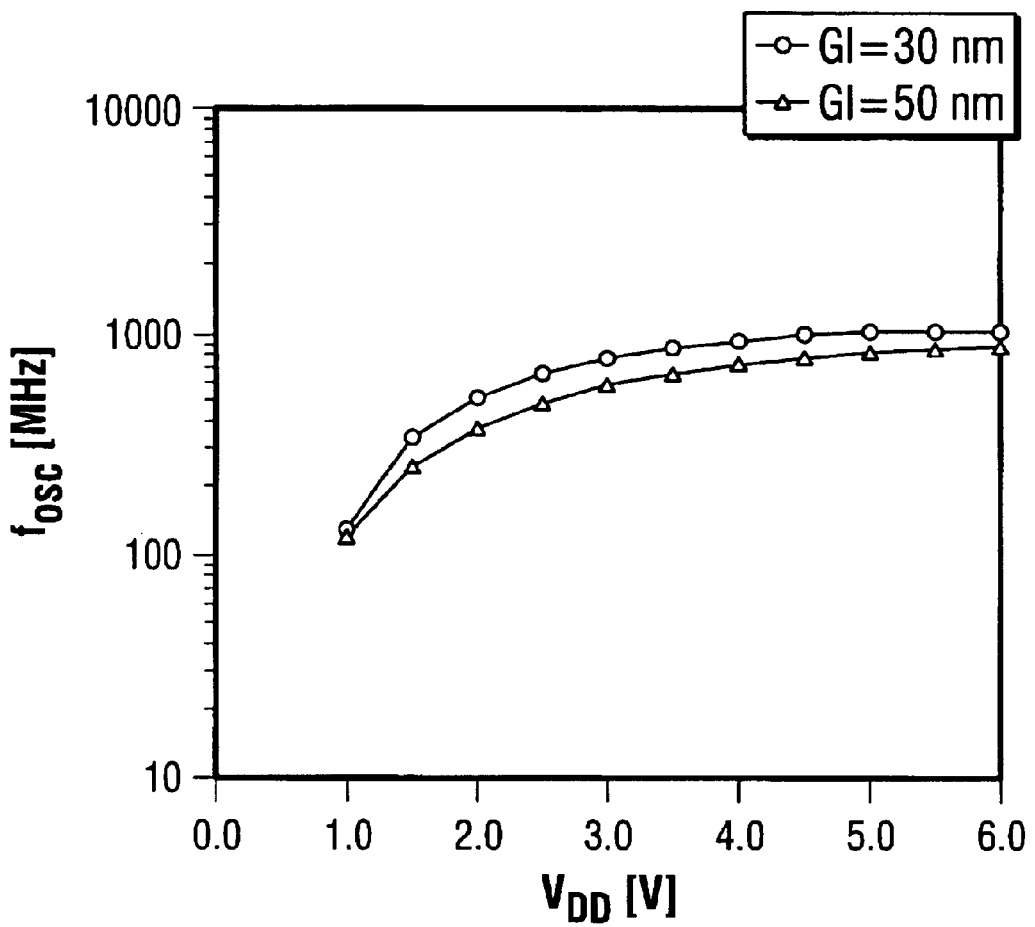
FIG. 9 is a view for explaining frequency characteristics of a ring oscillator.

FIG. 9 shows the result of measurement of an oscillation frequency of the ring oscillator at a power-supply voltage of 5V by a spectrum analyzer. In FIG. 9, the horizontal axis indicates a power-supply voltage ($V_{DD}$), and the vertical axis indicates an oscillation frequency ($f_{osc}$). As shown in FIG. 9, in the case where a TFT having a gate insulating film of 30 nm is used, an oscillation frequency of not less than 1 GHz is realized.

Figure 10:
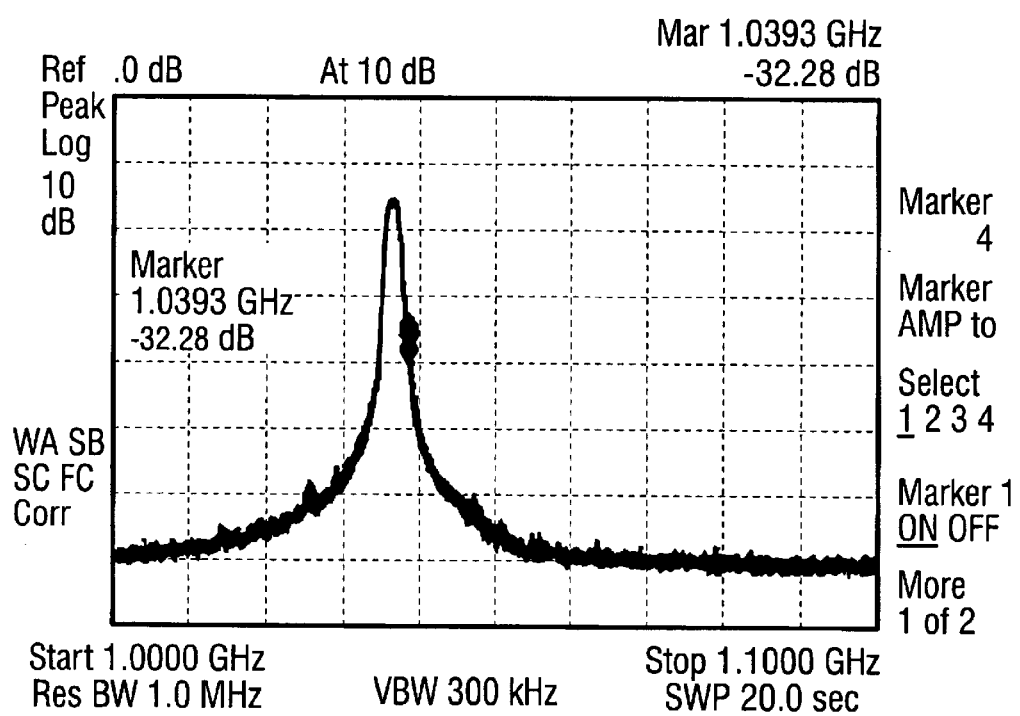
FIG. 10 is a photograph showing an output spectrum of a ring oscillator.

FIG. 10 shows the state of an output spectrum of the spectrum analyzer at the time when the oscillation frequency of 1.04 GHz was obtained. The horizontal axis indicates the frequency from 1 GHz to 1.1 GHz, and the vertical axis indicates a voltage (output amplitude) in terms of logarithm scale. As is apparent from FIG. 10, there is a peak of the output spectrum at 1.04 GHz. Incidentally, the output spectrum has a tail due to the resolution of the device, which does not influence the experimental result.

Figure 11:
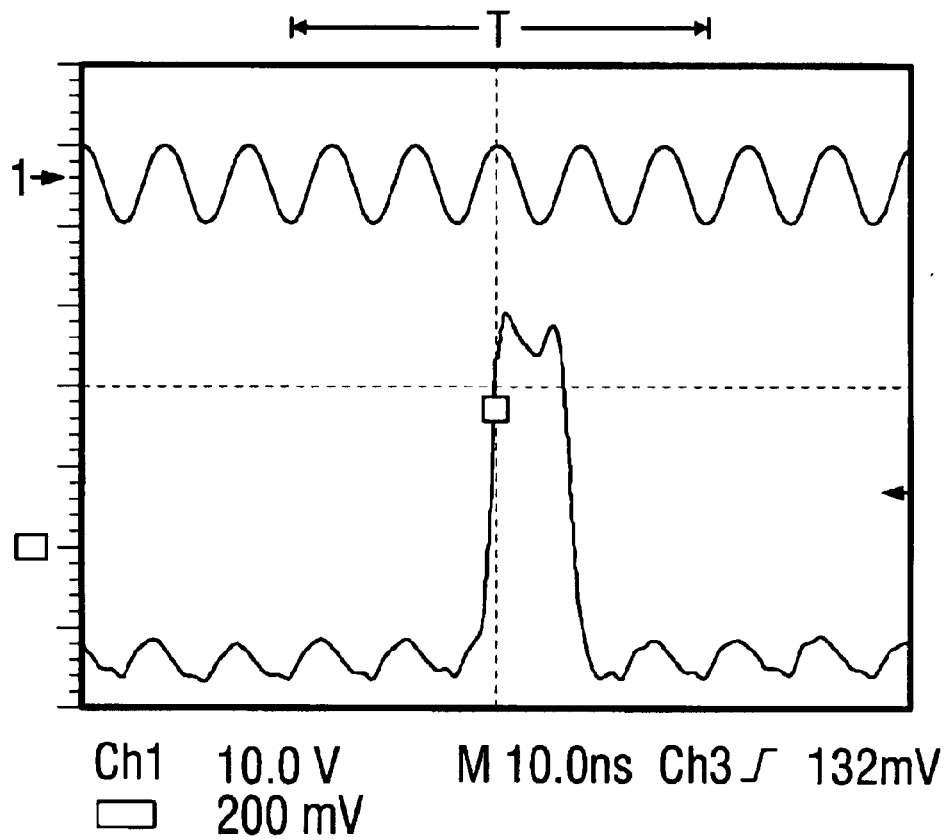
FIG. 11 is a photograph showing an output pulse of a shift register.

Also, a shift register as one of TEGs of LSI circuits was actually fabricated, and the output pulse when the shift register was driven at a driving frequency of 10 to 100 MHz was confirmed, whereby the operation performance of the shift register was examined. The screen (upper part shows a clock pulse, and the lower part shows an output pulse) of an oscilloscope shown in FIG. 11 expresses the output pulse of a shift register circuit in which a film thickness of a gate insulating film is 30 nm, a gate length is 0.6 $\mu$m, an operation frequency is 100 MHz, a power-supply voltage is 5 V, and the number of stages is 50.

Figure 12:
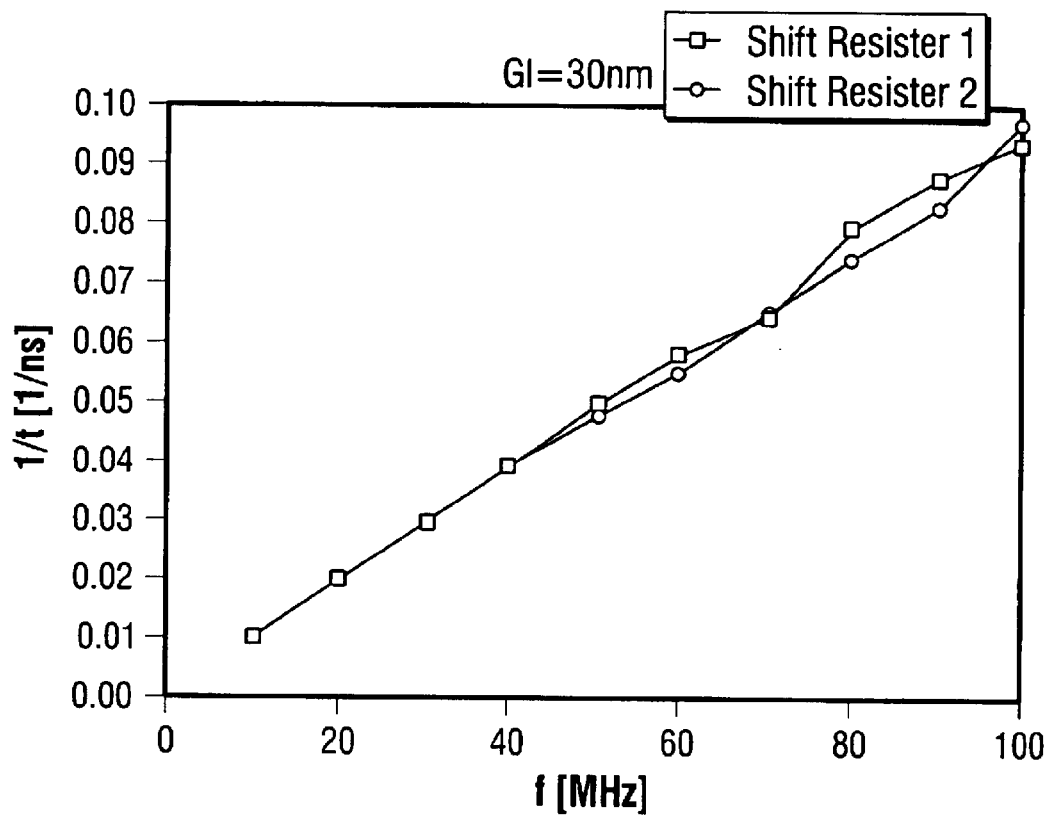
FIG. 12 is a view showing the relation between a frequency and a pulse width.

As a result of confirmation by the present inventors, as shown in FIG. 12, the inverse number (vertical axis) of the output pulse width "t" is in proportion to the operation frequency (horizontal axis), and it has been determined that the shift register has extremely high performance such that high frequency driving of 100 MHz is truly possible by oneself, and the output pulse with little distortion in an ideal state can be obtained. Incidentally, since two kinds of shift registers different from each other in the circuit structure were used in the experiments, the respective shift registers were referred to as shift register 1 and shift register 2.

The surprising data of the above ring oscillator and the shift register indicate that the TFT made of the unique crystal structure body has performance comparable to or higher than an IGFET using single crystal silicon.

Figure 13:
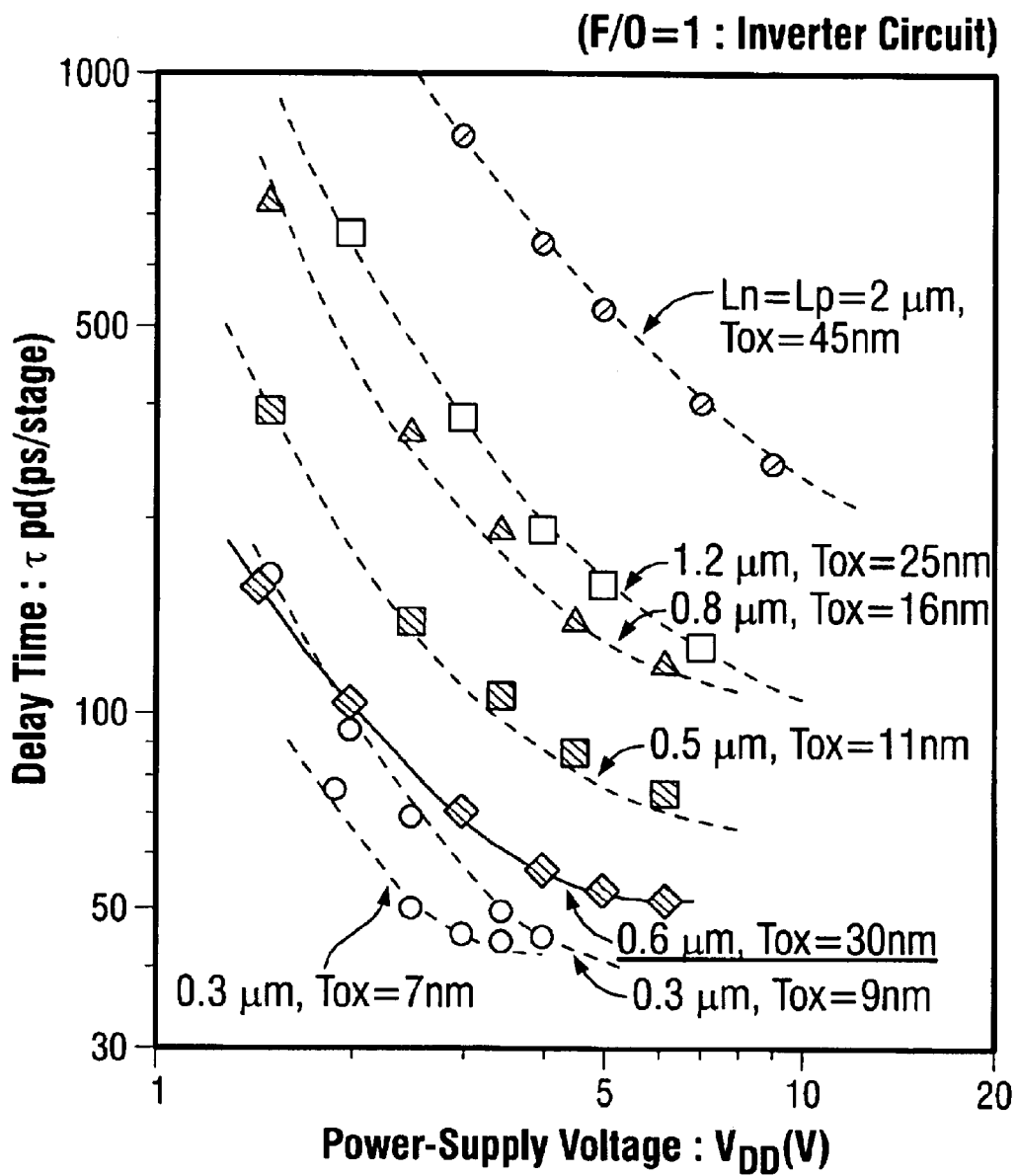
FIG. 13 is a view for explaining the scaling law.

The following data support the above. FIG. 13 is a graph in which the horizontal axis indicates a power-supply voltage ($V_{DD}$) and a vertical axis indicates a delay time ($\tau_{pd}$) for one stage of inverters of F/O=1 (fan-out ratio is 1) ("INNOVATION OF LOGIC LSI TECHNOLOGY", by Kenji Maeguchi et al., p 108, Science Forum Co., Ltd., 1995). Various curved lines (indicated by dotted lines) in the drawing show data when FETs using single crystal silicon are fabricated by various design rules, which shows the so-called scaling rule.

When the relation between the delay time of the inverter obtained by using the above-mentioned ring oscillator and the power-supply voltage, is applied to this drawing, a curved line shown by a solid line in FIG. 13 is obtained. It should be noted that the inverter fabricated by the TFT having a channel length of 0.6 $\mu$m and a gate insulating film with a thickness of 30 nm has more excellent performance than the inverter fabricated by the IGFET having a channel length of 0.5 $\mu$m and a gate insulating film with a thickness ($t_{ox}$) of 11 nm.

This shows apparently that the TFT made of the unique crystal structure body of the present invention has more excellent performance than the IGFET. For example, even if the film thickness of the gate insulating film constituting the above-mentioned TFT is made more than three times the IGFET, the TFT having the performance comparable to or superior to the IGFET can be obtained. That is, the TFT made of the unique crystal structure body has a dielectric strength superior to the general IGFET.

At the same, if the TFT made of the unique crystal structure body is made minute according to the scaling rule, it is possible to realize higher performance. This is possible because the TFT hardly receives the influence of the short channel effect, owing to the unique crystal structure body. For example, if the ring oscillator shown in FIG. 13 is fabricated in the rule of 0.2 $\mu$m, it is expected that the operation frequency of 9 GHz can be realized according to the scaling rule (since the operation frequency "f" is in inverse proportion to the square of the channel length L).

Also, the curved line shown by the solid line (inverter using the structure of the first embodiment) has a slope (inclination) gentler than other curved lines indicated by dotted lines (inverter using a normal IGFET) at a low voltage side, so that it may be said that the inverter of the present invention is particularly superior in the characteristics at the low voltage side.

As described above, the TFT made of the unique crystal structure body of the present invention has extremely superior characteristics, and the circuit constituted by using the TFT is a quite new device element capable of realizing a high speed operation more than 10 GHz. It becomes first possible to realize the system display including the logic circuit by obtaining the TFT as described above.

Second Structure of the Present Invention

The present inventors have contrived means for improving the integration of the system display and lowering the unevenness of characteristics of the TFTs. Here, the structure of the invention will be described below.

(Method of Adding Catalytic Element)

The crystalline silicon film made of the above-mentioned unique crystal structure body is formed by adding a metal element for promoting crystallization into an amorphous silicon film. The present inventors disclose a technique set forth in Japanese Patent Unexamined Publication No. Hei. 8-78329 as a means for transforming the amorphous silicon film into the crystalline silicon film. In the technique disclosed in the publication, a catalytic element (nickel, cobalt or the like) for promoting crystallization is selectively added into an amorphous silicon film, the amorphous silicon film is crystallized from the starting point of the added portion substantially in parallel to the surface of a substrate, and only the crystallized region in a lateral direction (hereinafter referred to as a lateral growth region) is used as an active layer of a TFT.

The structure of the above-described unique crystal structure body (structure made of a group of rod-shaped or flattened rod-shaped crystals) is caused by the shape of crystallization of such a lateral growth region. Thus, it may be said that the lateral growth region is a group of rod-shaped or flattened rod-shaped crystals or a group of a plurality of crystal regions arranged in stripe shape.

However, in the case where the system display shown in FIG. 1 is tried to be realized, if the technique disclosed in the publication is used as it is, restriction in circuit design due to the added region of the catalytic element becomes tangible. For example, in the publication, since a solution is spin coated, the width of the added region is required to be made at least 20 μm. The added region can not be used as an active layer since the catalytic element of high concentration exists therein. Thus the space of the added region becomes a dead space as it is in circuit design.

Further, since (1) the width of the added region has a limit, and (2) a catalytic element of the same concentration is added to the added region, all the lateral growth regions formed on the same substrate have the same growth distance, and the lateral growth regions of about 50 to 150 μm are formed under the thermal crystallization condition of 600° C. That is, in a region having a minute circuit structure, a plurality of TFTs are formed in one lateral growth region.

This becomes a large obstacle in realizing the system display shown in FIG. 1. It is desirable that TFTs required to make high speed operations and TFTs processing analog signals have characteristics as uniform as possible. However, since there is a case where the crystallinity is slightly different according to the position even in the same lateral growth region, when a plurality of TFTs are formed in the one lateral growth region, the characteristics of the TFTs becomes different according to the position.

In view of the above, the present inventors propose to add a catalytic element by using an ion implantation method (ion injection method) as a means for solving the problem which becomes tangible in realizing the system display of the present invention. Here, the method of adding the catalytic element using the ion implantation method and the advantage thereof will be described with reference to FIG. 2.

Figure 2:
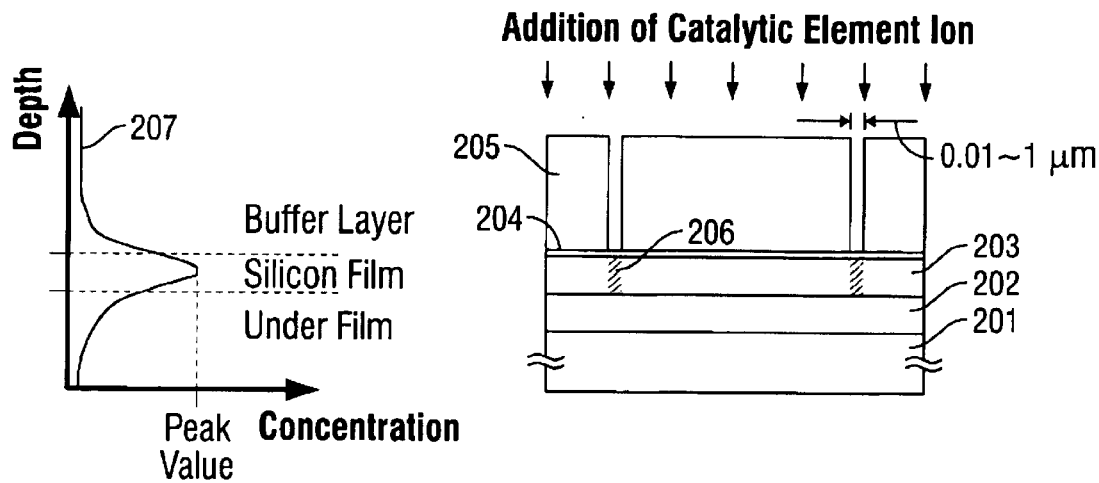
FIG. 2 is a view for explaining an ion implantation step.

In FIG. 2, reference numeral 201 denotes a substrate (including a glass substrate or a quartz substrate), 202 denotes an under film made of a silicon oxide film, 203 denotes an amorphous silicon film, and 204 denotes a silicon oxide film which becomes a buffer layer. Reference numeral 205 denotes a resist mask, and only a region where a catalytic element is to be added, is removed. It is preferable, as light exposure to the resist mask, to use a light exposure method using an excimer laser, a light exposure method using an electron beam or the like.

Since these light exposure methods enable the formation of an extremely minute pattern so that the added region of the catalytic element can be formed with a slit width of 0.01 to 1.0 μm (typically 0.1 to 0.35 μm). If the resist pattern is directly depicted by an electron beam or the like, the degree of freedom of shape of the added region is greatly increased.

As shown in a left drawing in FIG. 2, an ion is added in such a way that the peak value of an ion profile 207 is located within the amorphous silicon film 203. Thus, a region 206 in which a catalytic element of a predetermined concentration (preferably $3 \times 10^{19}$ to $1.5 \times 10^{21}$ atoms/cm$^3$) has been added, is formed in the amorphous silicon film 203.

Other than the ion implantation method in which mass separation is carried out, ions may be added by a plasma doping method (ion doping and the like) in which mass separation is not carried out. However, the ion implantation method is preferable since only the catalytic element can be added.

Also, in the structure shown in FIG. 2, the buffer layer 204 covers the amorphous silicon film 203 and only the catalytic element having passed through the buffer layer 204 is used. Thus, there is obtained an advantage that damage due to collision of ions at the ion implantation does not directly reach the amorphous silicon film 203.

Also, since only the vicinity of the peak value of the ion profile 207 is used, the amount of addition of the catalytic element can be controlled with good reproducibility by optimizing the condition of ion implantation. That is, since the growth distance of the lateral growth region is changed by the concentration of the added catalytic element, it is possible to easily control the growth distance in the lateral direction by using the ion implantation method.

This means that the lateral growth region with a desired size can be formed at a desired position. That is, it is possible to form the lateral growth region with a necessary and sufficient size in view of the size of a TFT (length of a channel formation region).

(Outline of the Second Structure)

Figure 3:
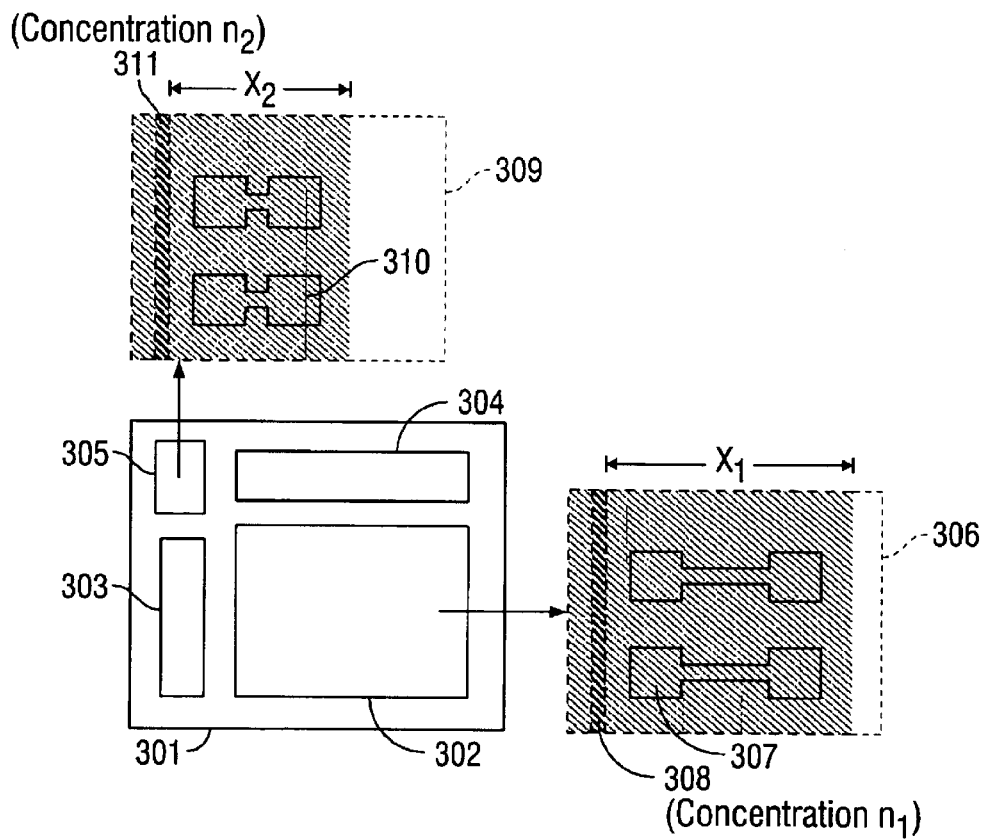
FIG. 3 is a view for explaining a second structure of the present invention.

According to the above means, as shown in FIG. 3, it becomes possible to form lateral growth regions having different growth distances on the same substrate. In FIG. 3A, 301 denotes a schematic view of a system display as shown in FIG. 1, 302 denotes a pixel matrix circuit, 303 and 304 denote driver circuits, and 305 denotes a logic circuit.

Since a TFT (pixel TFT) constituting the pixel matrix circuit 302 is required to have high withstand voltage characteristics, such a method as to prolong a channel length (gate length) is made. Thus, as indicated by reference numeral 306, such design is made that growth distance $X_1$ of a lateral growth region is longer than the length of an active layer 307. At this time, the concentration $n_1$ of a catalytic element added into an added region 308 may be adjusted after experimentally obtaining the relation between an added concentration and a growth amount.

On the other hand, since a TFT (logic TFT) constituting the logic circuit 305 is required to have high speed operation characteristics, such a method as to make a channel length short (typically 0.25 to 0.7 μm) is made. Thus, as indicated by reference numeral 309, growth distance $X_2$ of a lateral growth region may be adjusted in accordance with the length of an active layer 310 of the logic TFT. At this time, the concentration of the catalytic element in an added region 311 is made $n_2$.

As described above, in the case shown in FIG. 3, the lateral growth regions having the different growth distances $X_1$ and $X_2$ exist on the same substrate. In this case, $X_1 > X_2$. The lateral growth regions having the growth distances $X_1$ and $X_2$ are regions grown from the added regions with different concentrations of $n_1$ and $n_2$. In this case, $n_1 > n_2$. That is, this structure uses the phenomenon that the higher the concentration of a catalytic element existing in an added region is, the longer the growth distance of a lateral growth region is.

In this way, even if the added regions have the same shape, a lateral growth region with a desired width can be formed by adjusting the concentration of the catalytic element. That is, the gist of the second structure of the present invention is that in the case where a channel length is changed according to characteristics required by a circuit, a lateral growth region with a different growth distance in accordance with the channel length is formed.

The growth distance is made different in accordance with the channel length, and there is some correlation between the channel length and the growth distance of the lateral growth region. For example, it is conceivable that the concentration of the catalytic element is adjusted so that the distance of the channel length (or channel width) added with a fixed margin of several μm becomes the growth distance so as to make the channel formation region completely included in the lateral growth region, or that the concentration of the catalytic element is adjusted so that the distance twice the channel length (or channel width) becomes the growth distance. Although we can not say unconditionally since the correlation can be changed by an error in the growth distance or an accuracy of patterning at the formation of the active layer, the correlation is important for determining the concentration of addition of the catalytic element.

The advantage of the second structure of the present invention is that the lateral growth region does not have to be made excessively large especially in a region where a minute TFT is to be fabricated.

For example, in the case where an active layer of the logic TFT indicated by 309 is formed, if the width of the lateral growth region is made excessively long, the lateral growth region extends to a circuit having other different function, so that unevenness of characteristics of the TFT is caused as described before. If the unevenness of the TFT characteristics is caused in this manner, a harmful influence occurs in the case of constituting a circuit driven by an extremely high frequency or a circuit including a structure severely required to have uniformity of TFT characteristics, such as a differential amplifier or an operational amplifier.

Figure 4B:
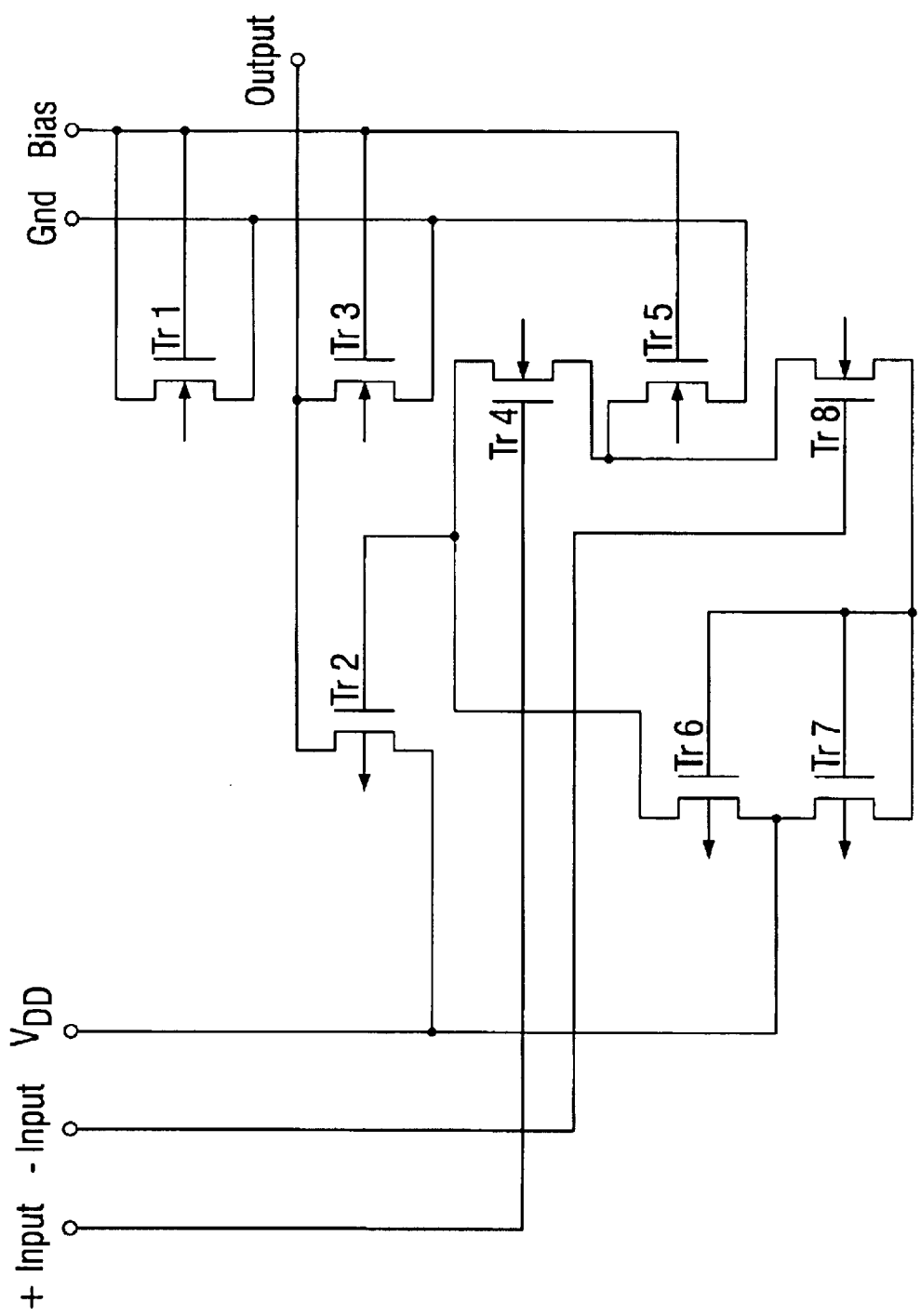

An example in which the second structure of the present invention is applied to an operational amplifier as an example of logic circuits, will now be described with reference to FIGS. 4A and 4B. FIG. 4A shows an example of an operational amplifier circuit constituted by eight TFTs Tr1 to Tr8, and FIG. 4B is a circuit diagram of the operational amplifier.

In FIG. 4A, 401 denotes an active layer made of the above-mentioned unique crystal structure body, and constitutes the TFTs Tr1 to Tr8. Reference numeral 402 denotes a first wiring layer, and is used as a lead wiring line of a gate insulating film of a TFT or for output (in the drawing, all wiring lines having the same pattern are in the same wiring layer). Reference numeral 403 denotes a second wiring layer, which connects TFTs to an input terminal, a power-supply terminal ($V_{DD}$ terminal), a GND terminal and a bias terminal. Reference numerals 404 to 407 denote regions where a catalytic element has been added by an ion implantation method.

At this time, the operational amplifier shown in FIG. 4A (or FIG. 4B) is constituted by a differential amplifying circuit, as a unit, made of the TFTs Tr4 and Tr8 (or Tr6 and Tr7). The differential amplifying circuit has a feature that even if temperature or power-supply voltage changes, the output is not influenced since the change acts on the two TFTs at the same time. However, for realizing the feature, it is a prerequisite that the characteristics of the two TFTs are coincident with each other.

For that purpose, there is contrived such a means that the added region 405 is arranged for the TFT Tr4 and the added region 407 is arranged for the TFT Tr8 so that the active layers constituting the TFTs Tr4 and Tr8 are arranged at positions located apart from the added regions of the catalytic element by the same distance. The similar measures are given also to the active layers constituting the TFTs Tr6 and Tr7.

Since the logic circuit constituted by the TFTs requires a high speed operation, the gate length is made minute to about 0.25 to 0.7 μm. Thus, the size of the circuit of the operational amplifier shown in FIG. 4A is about 5 to 20 μm.

However, according to the technique disclosed in Japanese Patent Unexamined Publication No. Hei. 8-78329, since the added region of the catalytic element has a width of at least 20 μm, it is impossible to form the added region between a TFT and a TFT. Further, since the lateral growth region becomes large more than necessity, it is impossible to contrive such a means as to make the TFT characteristics even. That is, it is possible to realize the structure shown in FIG. 4A by using the second structure of the present invention.

In the minute circuit as shown in FIG. 4A, if the lateral growth region becomes too large, its influence is exerted to the neighboring lateral growth region, which is not preferable. In the second structure of the present invention, it is possible to easily control the growth distance of the lateral growth region by adjusting the concentration of the catalytic element. Thus, even in the case where the added regions are formed with a minute arranging structure, it is possible to suppress the mutual interference among the lateral growth regions to the minimum.

Of course, in the case where a gate length is long as in the pixel TFT constituting the pixel matrix circuit, it is possible to prolong the growth distance by increasing the amount of addition of the catalytic element. In the case of a minute circuit in which unevenness of TFT characteristics is not problematic, it is also possible to constitute a plurality of active layers at the same time by increasing the concentration of the catalytic element to form a wide lateral growth region.

Embodiment 2

In the system display as shown in FIG. 1 of the embodiment 1, the circuit for constituting the logic circuit 105 and the driver circuits 103 and 104 has a basic unit of a CMOS circuit (inverter circuit) in which an N-channel TFT and a P-channel TFT are complementarily combined. Since these driving circuits sometimes require an extremely high driving frequency of 0.1 to 2 GHz, in some cases, more than 2 GHz, the gate length is made minute to 0.25 to 0.7 μm.

On the other hand, since the pixel matrix circuit 102 is required to have a high withstand voltage in the case of a liquid crystal display device, the gate length is formed within the range of about 2 to 20 μm. In some cases, a multi-gate TFT in which TFTs are substantially connected in series, is used.

In this embodiment, there is shown an example in which when TFTs with different device sizes according to characteristics required by circuits are arranged on the same substrate, lateral growth regions having different growth distances are formed according to the respective device sizes, and TFTs constituted of the unique crystal structure body are manufactured by using the regions. Here, as an example, steps of manufacturing a CMOS circuit and a pixel TFT on the same substrate will be described with reference to FIGS. 5 to 7.

Figure 5A:
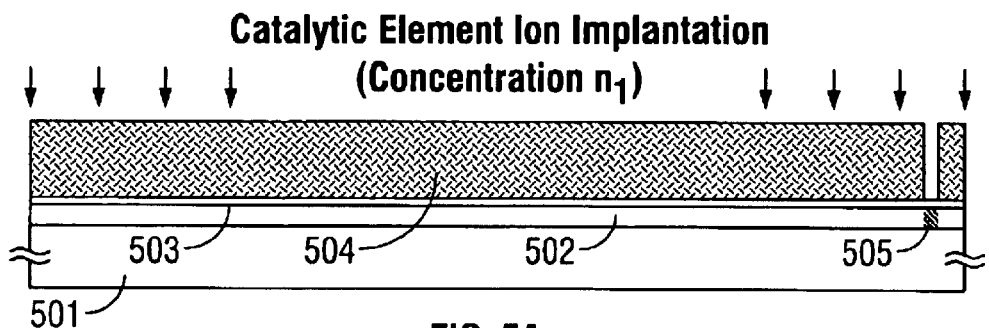
FIGS. 5A to 5E are views showing manufacturing steps of a CMOS circuit and a pixel TFT.

In FIG. 5A, 501 denotes a quartz substrate. Instead of the quartz substrate, a ceramic substrate having an insulating film with a thickness of 0.5 to 5 μm on the surface, a single crystal silicon wafer, or a polycrystalline silicon wafer may be used. Here, as the silicon wafer, such a low grade wafer as is used in a solar cell is sufficient, which is more inexpensive than quartz. Thus, the silicon wafer is effective when it is used in the case where a transparent substrate is not required to be used, as in a reflection type display device or an IC chip.

Reference numeral 502 denotes an amorphous silicon film, and the film thickness thereof is adjusted so that the final thickness (thickness in which the decrease in the film after thermal oxidation is taken into consideration) becomes 10 to 75 nm (preferably 15 to 45 nm). Film formation may be carried out by a low pressure thermal CVD method or a plasma CVD method. Reference numeral 503 denotes a thin oxide film with a thickness of about 5 to 50 nm obtained by oxidizing the amorphous silicon film 502.

Next, a resist mask 504 for selecting the added region of the catalytic element is formed. The resist mask 504 has a contact hole with a width of 0.01 to 1 μm as shown in FIG. 2. The contact hole is for forming a lateral growth region which subsequently becomes an active layer of a TFT constituting a CMOS circuit.

Then nickel (Ni) as a catalytic element to promote crystallization of the amorphous silicon film is added by an ion implantation method. As the catalytic element, cobalt (Co), iron (Fe), tin (Sn), lead (Pb), palladium (Pd), platinum (Pt), copper (Cu), gold (Au) and the like may be used instead of nickel.

At this time, nickel of a concentration of $n_1$ is added into an added region 505 so that a lateral growth region with a growth distance of $X_1$ is formed. Since the value of $n_1$ becomes different by the condition of a subsequent thermal crystallization step, the value may be experimentally determined by an operator (FIG. 5A).

Figure 5B:
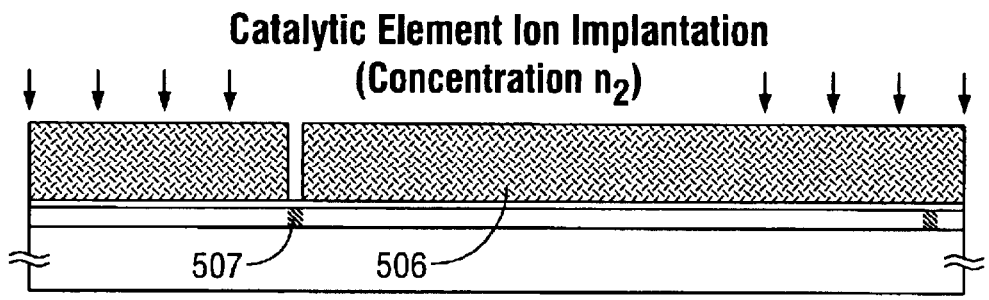

Next, after the resist mask 504 is removed, a resist mask 506 is again formed. This resist mask 506 is for forming a lateral growth region which subsequently becomes an active layer of a pixel TFT. Then nickel is again added by the ion implantation method. At this time, nickel of a concentration of $n_2$ is added into an added region 507 so that a lateral growth region with a growth distance $X_2$ is subsequently formed. The value of $n_2$ may be experimentally determined by an operator similarly to the above (FIG. 5B).

As described above, at least a part on the same substrate is added with the catalytic element of a concentration different from other added region.

Figure 5C:
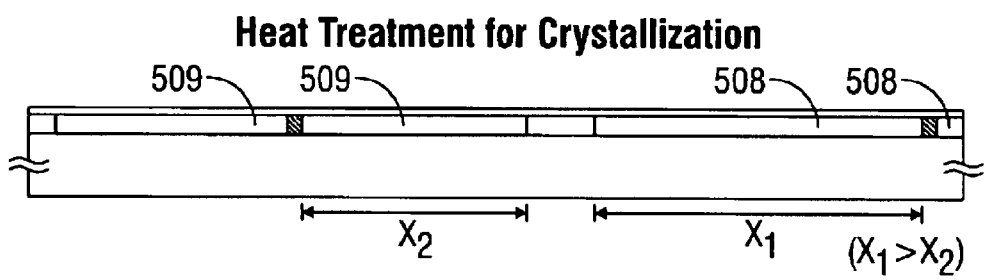

Next, a step of adding the catalytic element is ended, a heat treatment at a temperature of 500 to 700° C., typically 550 to 650° C. is carried out in an atmosphere containing an inert gas or hydrogen for 4 to 8 hours so that the amorphous silicon film 502 is crystallized. The crystallization proceeds while nickel (or nickel silicide) in the film becomes a nucleus (FIG. 5C).

The crystallization of the amorphous silicon film 502 proceeds first from the added regions 505 and 507 added with nickel, so that lateral growth regions 508 and 509 grown substantially in parallel to the substrate 501 are formed. As described above, the nickel concentration of the added region 505 is $n_1$, and the nickel concentration of the added region 507 is $n_2$ ($n_1 > n_2$), there is a relation of $X_1 > X_2$ between the lateral growth region 508 (growth distance $X_1$) and the lateral growth region 509 (growth distance $X_2$). That is, in at least one portion on the same substrate, a lateral growth region having a growth distance different from other lateral growth region is formed.

In the present invention, only the lateral growth regions 508 and 509 are used as crystalline silicon films. That is, since the position where the lateral growth region is formed can be freely designed by the arrangement of the added region, contrary to a conventional polysilicon film, crystal grain boundaries do not influence the characteristics of a TFT.

After the heat treatment for crystallization is ended, patterning is carried out to form island semiconductor layers (active layers) 510 to 512 made of only the lateral growth regions. Here, reference numeral 510 denotes an active layer of an N-channel TFT constituting the CMOS circuit, 511 denotes an active layer of a P-channel TFT constituting the CMOS circuit, and 512 denotes an active layer of an N-channel TFT constituting the pixel TFT (FIG. 5D).

Figure 5D:
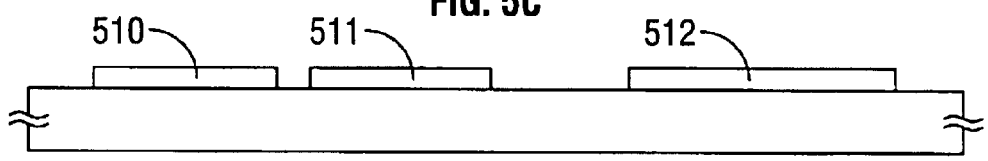

Even in the state as shown in FIG. 5D, there remain some traces indicating that the lateral growth regions 508 and 509 existed. For example, since the added regions 505 and 507 are made silicide to preferentially disappear, recesses are formed in the under layer (quartz in this case) just under the portions where the added regions existed. Also, since the catalytic element segregates at the end portion of the lateral growth region (terminal point of crystallization), a recess is formed in the under layer at this region. Further, since the added regions 505 and 507 are different from each other in the concentration of addition of the catalytic element, it is conceivable that the crystallinity and shape of the rod-shaped or flattened rod-shaped crystals are different according to the concentration of addition.

After the active layers 510 to 512 constituted by crystal silicon films made of the lateral growth regions are formed, a gate insulating film 513 made of a silicon oxide film is grown on the active layers 510 to 512. At this time, it is desirable that the film thickness of the gate insulating film 513 at a CMOS circuit side (indicated by 514) is made different from the film thickness at a pixel TFT side (indicated by 515).

It is because a TFT having a short gate length for high frequency driving is formed in the CMOS circuit, so that an operation voltage is required to be made low in view of a low drain withstand voltage. Thus, it is preferable that the film thickness of the gate insulating film is made not less than 2 nm and less than 80 nm (typically 50 nm) so that a threshold voltage is lowered and the operation voltage is lowered. On the other hand, since the pixel TFT has a high operation voltage, it is effective to contrive a means for increasing a drain withstand voltage by making the film thickness of the gate insulating film not less than 80 nm and not larger than 250 nm (typically 120 nm)

In order to form the gate insulating films having different film thicknesses on the same substrate, there may be used such a method that a lamination layer is selectively formed by using a mask, or a thermal oxidation film is formed on a specific active layer by using a selective oxidation method such as a LOCOS method so that the film thickness is made thick. In the case where the final thickness of the gate insulating film becomes not larger than 50 nm, only a thermal oxidation film obtained in a later thermal oxidation step may be used as the gate insulating film.

Figure 5E:
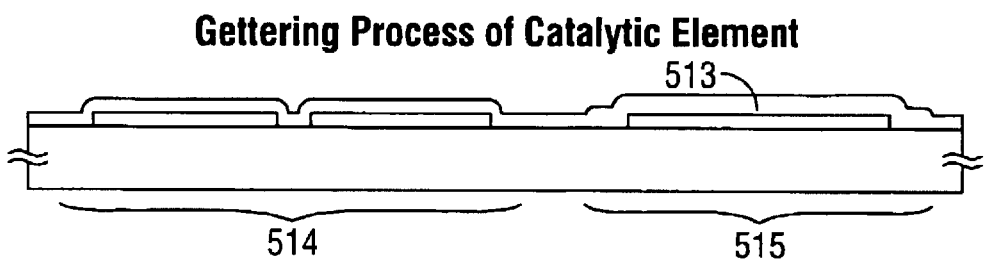

Next, as shown in FIG. 5E, a heat treatment for removing the catalytic element (nickel) by gettering (gettering process of the catalytic element) is carried out. This heat treatment uses a gettering effect of a metal element by a halogen element. In order to obtain the gettering effect by the halogen element, it is preferable to carry out the above heat treatment at a temperature exceeding 700° C. Thus, in this embodiment, the heat treatment is carried out at a temperature exceeding 700° C., preferably 800 to 1,000° C. (typically 950° C.), and the processing time is 0.1 to 6 hours, typically 0.5 to 1 hour.

Here, there is shown an example in which a heat treatment at 950° C. for 30 minutes is carried out in an oxygen ($O_2$) atmosphere containing hydrogen chloride (HCl) of 0.5 to 10 vol % (3 vol % in this example). When the concentration of HCl is made higher than the above concentration, the unevenness comparable to the film thickness is formed on the surface of the active layer 209, so that the higher concentration is not preferable.

When an atmosphere is made by mixing nitrogen ($N_2$) of a high concentration into the above oxidizing atmosphere, an oxidation speed of the crystalline silicon film can be lowered. This is an effective means in the case where a gettering time is increased without progressing the thermal oxidation reaction more than necessity.

Although an HCl gas is used as a compound containing the halogen element, one kind or plural kinds of compounds selected from the group typically consisting of HF, NF$_3$, HBr, Cl$_2$, ClF$_3$, BCl$_3$, F$_2$, Br$_2$ and the like may be used other than the HCl gas.

It is conceivable that in this step, nickel added into the lateral growth regions 508 and 509 is gettered by the function of chlorine and is changed into volatile nickel chloride which escapes into the air, so that the nickel is removed. Incidentally, since the oxide film 503 on the silicon film and a thermal oxidation film formed in the gettering process are extremely thin, they do not become blocking layers to prevent the escape of nickel chloride.

Then the concentration of nickel in the lateral growth regions 508 and 509 is decreased to $1 \times 10^{17}$ atoms/cm$^3$ or less (preferably to spin density or less) through gettering process of catalytic element. Incidentally, the impurity concentration in the present invention is defined as the minimum value of measurement values obtained by SIMS analysis. Incidentally, by the similar SIMS analysis, it is confirmed that the halogen element with a concentration of $1 \times 10^{15}$ to $1 \times 10^{20}$ atoms/cm$^3$, which was used for the gettering process, remains in the lateral growth regions 508 and 509.

By the above heat treatment, the thermal oxidation reaction proceeds at the interfaces between the active layers 510 to 512 and the gate insulating film 513, and the total film thickness of the gate insulating film 513 increases by the formed thermal oxidation film (not shown). Thus, the active layers 510 to 512 are made thin in proportion to the formation of the thermal oxidation film. When the film thickness of the active layer is made thin, effects such as decrease of an off-state current of a TFT, or improvement of a field effect mobility, are promoted. At that time, it is confirmed by the SIMS analysis that the above halogen element with a high concentration is distributed between the active layers 510 to 512 and the thermal oxidation film formed by the heat treatment. After the heat treatment in the halogen atmosphere is carried out, a heat treatment at a temperature of 950° C. is carried out for about one hour in a nitrogen atmosphere, so that the film quality of the gate insulating film 513 is improved and at the same time, an extremely superior interface between the semiconductor and the insulating film can be realized.

The crystalline silicon film formed through the above described steps is made of the unique crystal structure body as described in the embodiment 1. That is, it becomes possible to realize a TFT having extremely excellent electrical characteristics as shown in the embodiment 1.

Figure 6A:
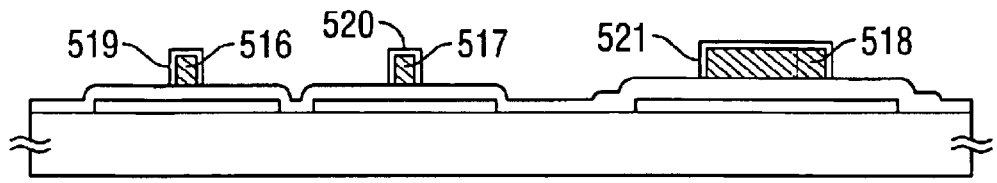
FIGS. 6A to 6E are views showing manufacturing steps of a CMOS circuit and a pixel TFT.

Next, an aluminum film (not shown) containing scandium of 0.2 wt % is formed, and an electrode pattern which becomes an original of a subsequent gate electrode, is formed. The surface of the pattern is subjected to anodic oxidation to form gate electrodes 516 to 518, and anodic oxidation films 519 to 521 (FIG. 6A).

At this time, the line width (gate length) of the gate electrodes 516 to 518 may be determined in view of the characteristics required by circuits. The width may be made 0.25 to 0.7 μm for a logic circuit and the like requiring high frequency driving, and the width may be made 2 to 20 μm for a pixel matrix circuit and the like requiring high withstand voltage characteristics.

Figure 6B:
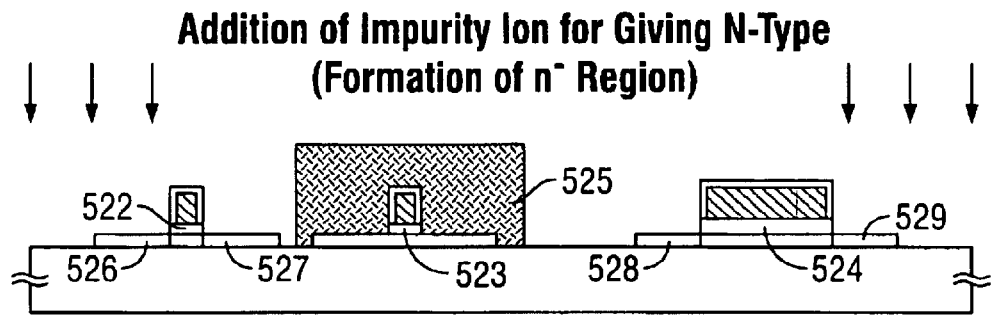

Next, etching of the gate insulating film 513 is carried out in a self-alignment manner by using the gate electrodes 516 to 518 as masks. Etching may be carried out by a dry etching method using a CHF$_3$ gas. By this step, gate insulating films 522 to 524 remaining only just under the gate electrodes are formed. Next, after a resist mask 525 covering the region which becomes a P-channel TFT, is formed, an impurity ion for giving an N-type is added. The addition of the impurity ion may be carried out by an ion implantation method or a plasma doping method. Since the concentration (denoted by n−) at this time subsequently becomes a concentration (about $1 \times 10^{18}$ to $1 \times 10^{19}$ atoms/cm$^3$) of an LDD region, it is necessary to previously obtain an optimum value experimentally and to precisely control the concentration. In this way, n− regions 526 to 529 are formed (FIG. 6B)

Figure 6C:
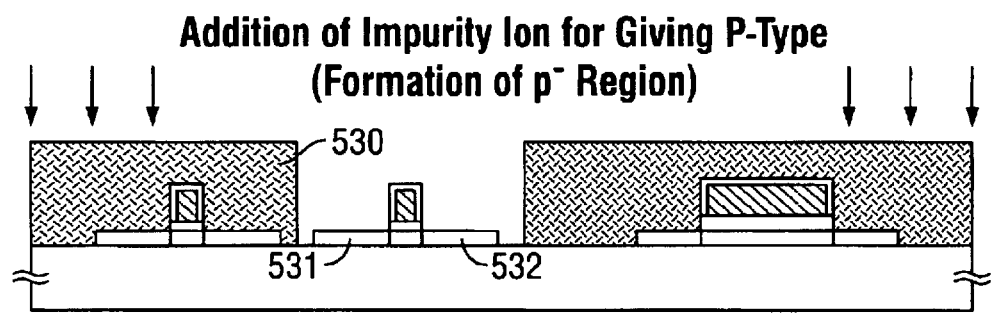

After the n− regions 526 to 529 are formed, the resist mask 525 is removed, and then a resist mask 530 covering an N-channel TFT is formed. Then an impurity ion for giving a P-type is added to form p− regions 531 and 532. Since the concentration of these p− regions 531 and 532 also become a concentration (about $5 \times 10^{18}$ to $5 \times 10^{19}$ atoms/cm$^3$) of an LDD region, it is necessary to precisely control the concentration (FIG. 6C).

Figure 6D:
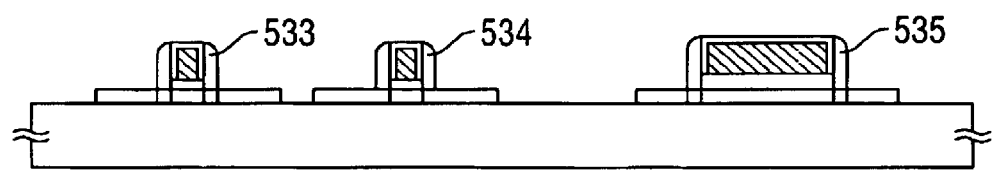

In this way, after the n-regions 526 to 529, and the p-regions 531 and 532 are formed, the resist mask 530 is removed. Then a not-shown silicon oxide film with a thickness of 0.5 to 2 μm is formed, and side walls 533 to 535 are formed by an etch-back method (FIG. 6D).

Next, a resist mask 536 covering the P-channel TFT is formed again, and an impurity ion for giving an N-type is added. The concentration (denoted by n+) of the ion at this addition is made higher than the above-mentioned concentration n−. This concentration is adjusted so that the sheet resistance of source/drain regions becomes 500 Ω or less (preferably 300 Ω or less).

Figure 6E:
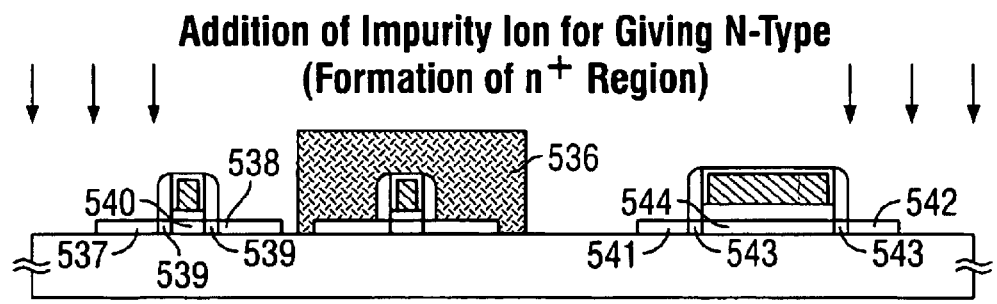

By this step, a source region 537 and a drain region 538 of the N-channel TFT constituting the CMOS circuit are formed. A region 539 the concentration of which has not been changed since it is shaded by the side wall, becomes a low concentration impurity region (especially the region at the drain region side is referred to as an LDD region). The region just under the gate electrode becomes an intrinsic or substantially intrinsic channel formation region 540. At the same time, there are formed a source region 541, a drain region 542, a low concentration impurity region 543 and a channel formation region 544 of the N-channel TFT which becomes a pixel TFT (FIG. 6E).

Figure 7A:
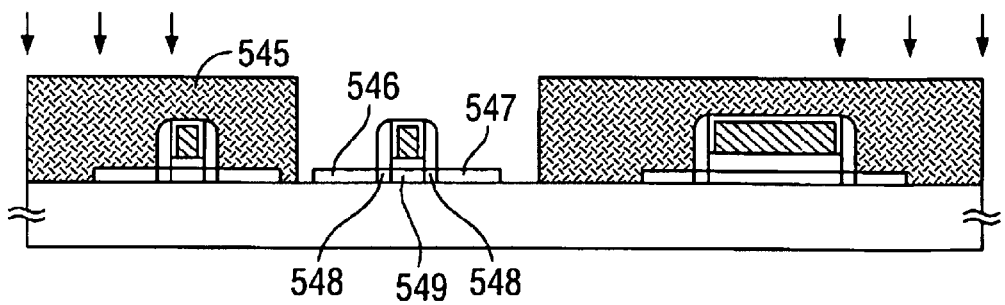
FIGS. 7A to 7D are views showing manufacturing steps of a CMOS circuit and a pixel TFT.
Figure 7B:
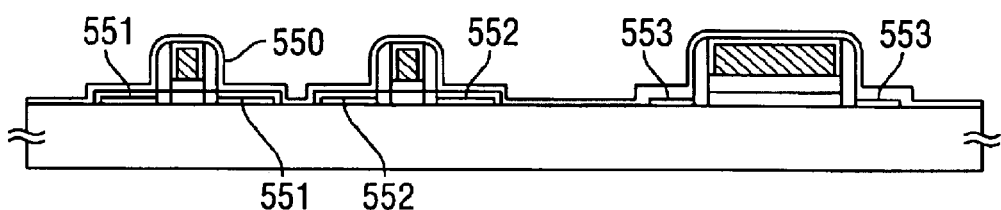

Next, the resist mask 536 is removed, and a resist mask 545 covering the N-channel TFT is formed. An impurity ion for giving a P-type is added with a concentration (denoted by p+) higher than the first addition, so that a source region 546, a drain region 547, a low concentration impurity region 548 and a channel formation region 549 of the P-channel TFT constituting the CMOS circuit, are formed (FIG. 7A).

All active layers are completed in the way described above. After all the addition steps of impurity ions are ended, the resist mask 545 is removed and then activation of impurity ions is carried out by a heat treatment such as furnace annealing, laser annealing or lamp annealing. Incidentally, damage given to the active layers at the ion implantation is recovered at the same time.

Next, a titanium (Ti) film 550 with a thickness of 20 to 50 nm is formed, and a heat treatment by lamp annealing is carried out. At this time, silicon films having been in contact with the titanium film 550 are made silicide, so that titanium silicide films 551 to 553 are formed in the source/drain regions. Tungsten (W), tantalum (Ta), molybdenum (Mo) or the like may be used instead of titanium.

After making silicide, the titanium film 550 is patterned to form island patterns 554 to 556 on the source/drain regions.

The island patterns 554 to 556 are provide to prevent the titanium silicide films 551 to 553 from disappearing at the later formation of contact holes for connecting the source/drain regions to wiring lines. Of course, if a selective ratio of the titanium silicide to an interlayer insulating film in which the contact hole is formed, is large, the island patterns 554 to 556 may be omitted.

Figure 7C:
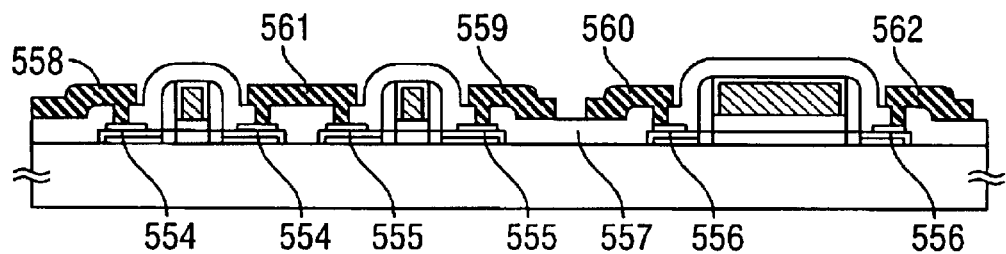

Next, a silicon oxide film with a thickness of 0.3 to 1 μm is formed as a first interlayer insulating film 557. Then contact holes are formed, and source wiring lines 558 to 560 and drain wiring lines 561 and 562 are formed. In this way, the state as shown in FIG. 7C is obtained. As the first interlayer insulating film 557, an organic resin film may be used.

When the state shown in FIG. 7C is obtained, a second interlayer insulating film 563 having a thickness of 0.5 to 3 μm and made of an organic resin film is formed. Polyimide, acryl, polyamide, polyimide amide or the like may be used as the organic resin film. There are enumerated such merits of the organic resin film that (1) a film forming method is simple, (2) a film thickness can be easily made thick, (3) a relative dielectric constant is low so that parasitic capacitance can be decreased, and (4) flatness is superior.

A black mask 564 having a thickness of 100 nm and made of a film having light blocking properties is formed over the pixel TFT on the interlayer insulating film 563. Actually, the black mask is disposed on a place which requires blocking the light, such as on the wiring line of the pixel matrix circuit, or on the TFT. In this embodiment, although the titanium film is used as the black mask, a resin film containing black pigments may be used.

Figure 7D:
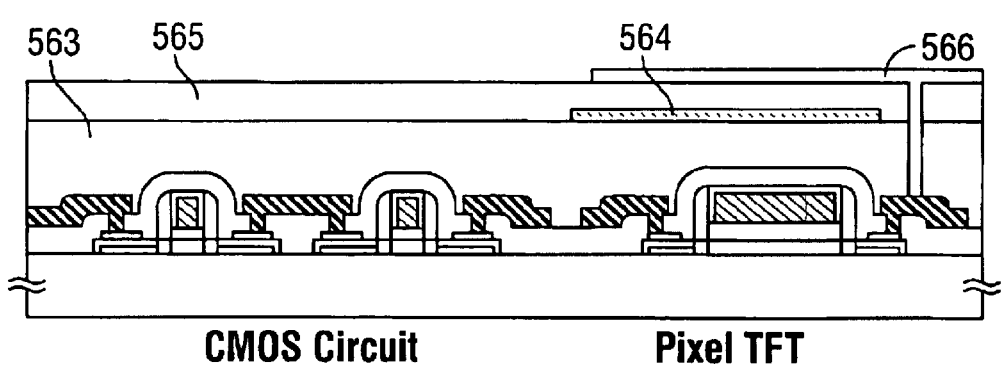

After the black mask 564 is formed, an organic resin film with a thickness of 0.1 to 0.3 μm is again formed as a third interlayer insulating film 565. Then a contact hole is formed in the second interlayer insulating film 563 and the third interlayer insulating film 565, and a pixel electrode 566 with a thickness of 120 nm is formed (FIG. 7D).

When a manufactured display device is of a transmission type display device, a transparent conductive film (for example, an ITO film) may be used as the pixel electrode 566, and when it is of a reflection type display device, a reflective conductive film (for example, an aluminum film) may be used as the pixel electrode 566.

At this time, in the region where the black mask 564 overlaps with the pixel electrode 566, an auxiliary capacitance is formed. This auxiliary capacitance functions as storage capacitance for keeping a voltage applied to the pixel electrode at a constant. Thus, in this embodiment, the third interlayer insulating film 565 is used as an insulator for constituting the auxiliary capacitance. If the third interlayer insulating film 565 is made of a silicon oxide film or a silicon nitride film having a higher relative dielectric constant, it is possible to increase the capacity of the auxiliary capacitance.

Finally, the entire of the substrate is heated in a hydrogen atmosphere to hydrogenate the entire of the element, so that dangling bonds (unpaired bonds) in the films (especially in the active layers) are compensated. Through the above steps, the CMOS circuit and the pixel TFT can be formed on the same substrate.

Embodiment 3

Figure 14A:
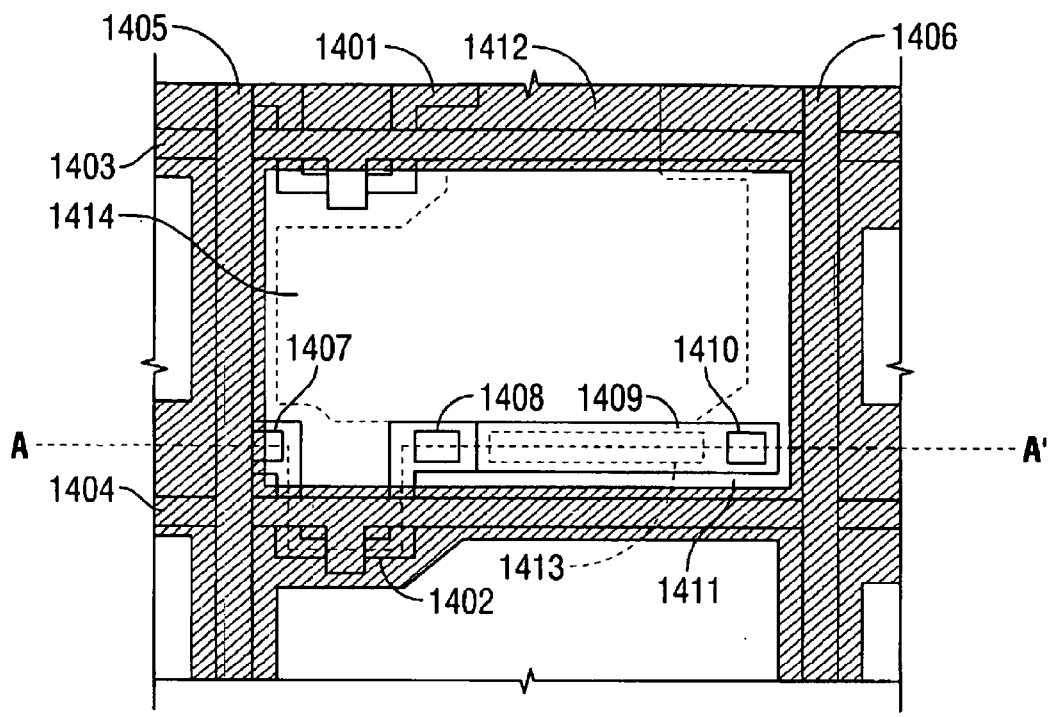
FIGS. 14A and 14B are views for explaining the construction and structure of a pixel region.

In this embodiment, an example of a structure of a pixel region constituting a pixel matrix circuit in the system display as shown in FIG. 1, will be described. FIG. 14A is a top view showing the pixel region.

In FIG. 14A, 1401 and 1402 denote active layers, 1403 and 1404 denote gate lines, and 1405 and 1406 denote source lines. Actually, the plurality of source lines and gate lines are arranged to perpendicularly intersect with each other, and a plurality of regions which are surrounded by the source lines and the gate lines and are arranged in matrix, function as the pixel regions 110 in FIG. 1.

The gate line 1404 is overlapped at three portions above the active layer 1402. That is, a triple gate TFT having the same structure as three pixel TFTs connected in series to each other, is formed.

The gate wiring lines 1405 and 1406 may be disposed in the layer lower than the active layers 1401 and 1402 to form a structure like a reverse stagger type TFT. In this case, it is preferable to use a material having high heat resistance, such as a polysilicon film, for a gate electrode so that the gate electrode can withstand such a heat treatment as in FIG. 5E, which is carried out in the manufacturing steps of the silicon thin film.

Reference numeral 1407 denotes a contact portion of the active layer 1402 (source region) and the source line 1405, 1408 denotes a contact portion of the active layer 1402 (drain region) and the drain wiring line 1409, and 1410 denotes a contact portion of the drain wiring line 1409 and the pixel electrode 1411.

A region 1412 indicated by oblique lines is a black mask, and is formed to shade the active layers 1401 and 1402, the gate wiring lines 1403 and 1404, and the source lines 1405 and 1406. The black mask 1412 overlaps with the drain wiring line 1409 at a region 1413, so that an auxiliary capacitance is formed between the black mask and the drain wiring line 1409.

A pixel electrode 1411 is disposed on the black mask 1412 through a third interlayer insulating film. The pixel electrode 1411 is structured so that the edge portion thereof is shaded by the black mask 1412 without fail, and a region 1414 which does not overlap with the black mask 1412 becomes an image display region for forming an image. Actually, an opposite substrate, an opposite electrode and a liquid crystal layer are disposed above the pixel electrode 1411 to constitute the liquid crystal cell 112 shown in FIG. 1.

Figure 14B:
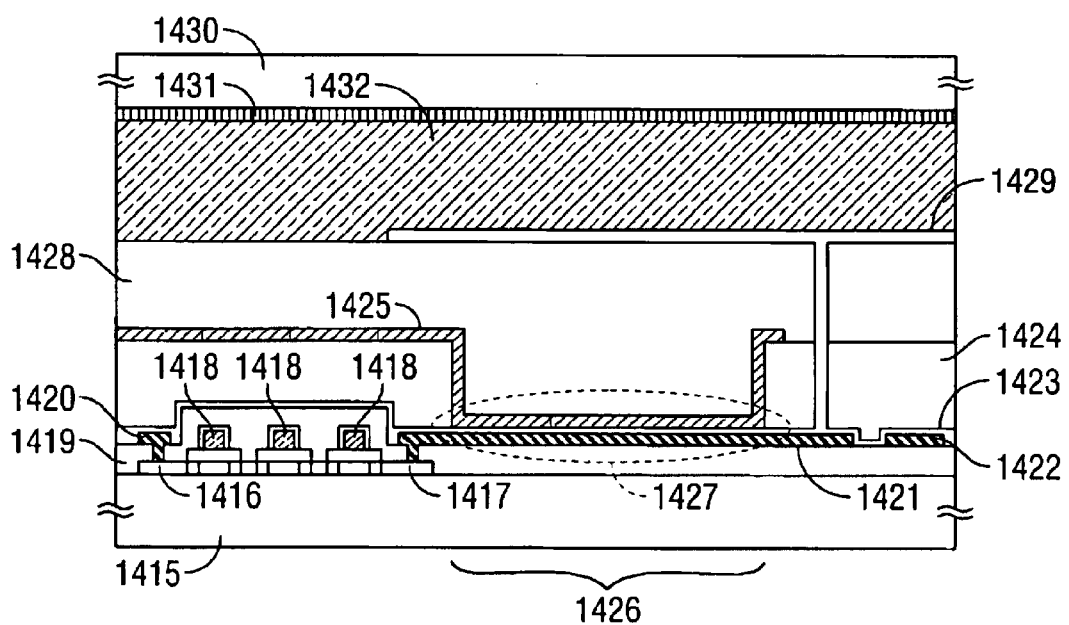

FIG. 14B is a sectional view taken along line A—A' in FIG. 14A. Since a basic transistor structure has been described in the embodiment 2, only the correspondence of FIG. 14B to FIG. 14A will be described here.

In FIG. 14B, 1415 denotes a quartz substrate, 1416 and 1417 respectively denotes a source region and a drain region of the active layer 1402 in FIG. 14A. Reference numeral 1418 denotes a gate electrode, which corresponds to the gate wiring line 1404 in FIG. 14A. Although it appears that three gate electrodes are disposed side by side in the drawing, they are actually constituted by the same wiring line as shown in FIG. 14A.

A source wiring line 1420 (corresponding to 1405 in FIG. 14A) and a drain wiring line 1421 (corresponding to 1409 in FIG. 14A) are disposed on a first interlayer insulating film 1419. Reference numeral 1422 denotes a source line adjacent to the source line 1420.

A second interlayer insulating film 1423, which is made of a silicon oxide film, a silicon nitride film or a lamination film thereof and has a thickness of 50 to 200 nm, is formed to cover the source wiring line 1420 and the drain wiring line 1421. A third interlayer insulating film 1424 made of an organic resin film is formed thereon. Further, a black mask 1425 (corresponding to 1412 in FIG. 14A) is disposed on the third interlayer insulating film 1424.

At this time, before forming the black mask 1425, the third interlayer insulating film 1424 at a region 1426 is removed. Thus, in the region 1426, an auxiliary capacitance 1427 formed of a laminated structure of the drain wiring line 1421, the second interlayer insulating film 1423 and the black mask 1425 is formed. The auxiliary capacitance 1427 corresponds to the auxiliary capacitance 1411 in FIG. 14A.

If the auxiliary capacitance 1427 is made to have the structure as shown in FIG. 14B, since the capacity of the auxiliary capacitance is determined by the second interlayer insulating film 1423, the capacity can be increased by using a material having a high relative dielectric constant or by thinning the film thickness. However, in order to form the auxiliary capacitance 1427, since the third interlayer insulating film 1424 must be removed while leaving only the second interlayer insulating film 1423 in the region 1426, the second and third interlayer insulating films must be selectively etched. In such a sense, as the second interlayer insulating film 1423, a silicon oxide film or a lamination film of a silicon oxide film and a silicon nitride film is effective.

Reference numeral 1428 denotes a fourth interlayer insulating film made of an organic resin film, and a pixel electrode 1429 is formed thereon. At this time, the pixel electrode 1429 is electrically connected to the drain region 1417 through the drain wiring line 1421. Thus, the auxiliary capacitance 1427 can be regraded as a capacitance connected to the pixel electrode 1429 in series.

A substrate 1430 is an opposite substrate on which an opposite electrode 1431 is formed. A liquid crystal layer 1432 is held by bonding the active matrix substrate 1415 to the opposite substrate 1430 so that the liquid crystal cell 112 in FIG. 1 is formed.

Embodiment 4

In this embodiment, an example in which a CMOS circuit having a structure different from the embodiment 2 is constituted, will be described with reference to FIGS. 15A and 15B. Since the basic structure in FIGS. 15A and 15B are the same as the CMOS circuit described in the embodiment 2, the same reference numerals as the embodiment 2 are properly used.

Figure 15A:
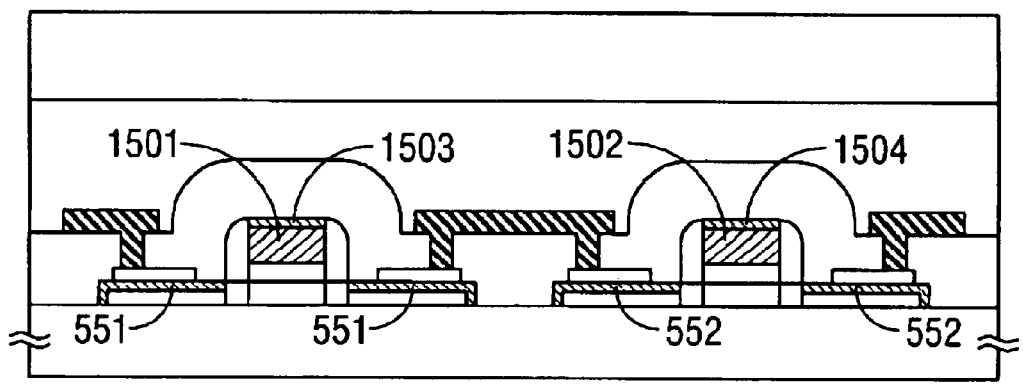
FIGS. 15A and 15B are views showing the structure of a CMOS circuit.

FIG. 15A shows an example in which in the CMOS circuit shown in the embodiment 2, the CMOS circuit is constituted by a silicon gate type TFT having gate electrodes 1501 and 1502 using silicon thin films (polysilicon films) given one conductivity. The TFT may be a dual gate type TFT in which the conductivity of the gate electrodes are made different (N-type or P-type) between an N-channel TFT and a P-channel TFT.

When such a silicon gate structure is made, titanium silicide films 1503 and 1504 are formed on the upper portion of the gate electrodes 1501 and 1502 at the same time as the formation of the titanium silicide films 551 and 552. Thus, ohmic contact between the gate electrode and the connection wiring line connected to the gate electrode can be made more excellent.

Figure 15B:
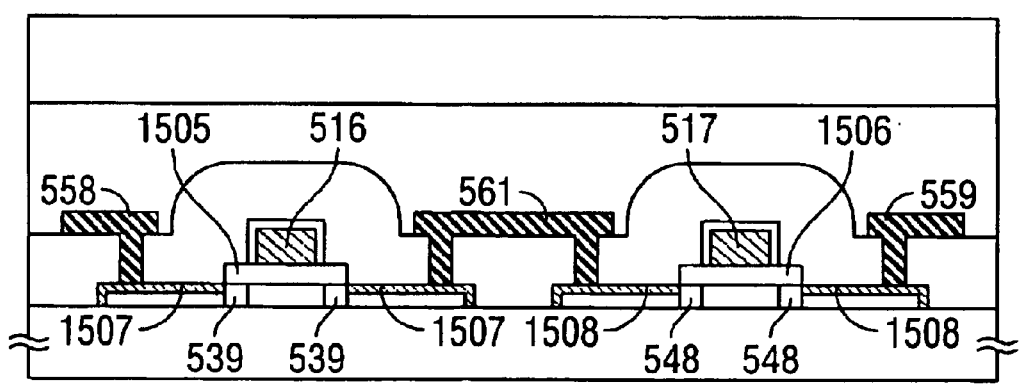

FIG. 15B shows an example in which in the CMOS structure shown in the embodiment 2, the side walls 533 and 534 and the island patterns 554 and 555 made of titanium are not formed. In this structure, the lengths of low concentration impurity regions 539 and 548 are determined by the width of the end portion (portion extending outside gate electrodes 516 and 517) of gate insulating films 1505 and 1506. Further, such a structure is obtained that titanium silicide films 1507 and 1508 are brought into direct contact with source wiring lines 558, 559 and 561.

The main function of the side walls 533 and 534 in the embodiment 2 is to determine the length of the low concentration impurity regions 539 and 548 and the concentration of addition. However, in the structure shown in FIG. 15B, since the technique disclosed in Japanese Patent Unexamined Publication No. Hei. 7-135318 is used, it is possible to make the structure using no side wall.

The main function of the island patterns 554 and 555 in the embodiment 2 is to secure ohmic contact between the titanium silicide films 551 and 552 formed in the source/drain regions and the source/drain wiring lines. In this case, the island patterns 554 and 555 also function as protective layers for preventing the titanium silicide films 551 and 552 from being removed when the contact hole is formed in the interlayer insulating film 557.

In this embodiment, a contact hole is formed by a dry etching method, and a ratio of selection between the interlayer insulating film 557 and the titanium silicide films 551 and 552 is raised, so that such a structure is formed that the island patterns 554 and 555 are not required as protective layers.

By simplifying the steps of forming the side walls 533 and 544 and the island patterns 554 and 555 in the way described above, it is expected that the throughput is improved, the yield is improved, and the manufacturing cost is lowered.

Embodiment 5

It has been already described that the silicon thin film described in the first structure of the present invention is necessary to practice the present invention. In this embodiment, an example in which a silicon thin film crystallized by a means different from the embodiment 2 is used for the present invention, will be described.

In FIG. 5, after obtaining the state (stage when the heat treatment for crystallization is ended) shown in FIG. 5C, an oxide film 503 on the surface of a crystalline silicon film is removed. After the oxide film 503 is removed, annealing by an excimer laser using KrF (wavelength 248 nm), XeCl (wavelength 308 nm) or the like as an excitation gas, is carried out. The laser annealing step may be carried out before or after processing the silicon thin film into an island-like pattern.

By the above-mentioned laser annealing, an amorphous component slightly remaining in the crystalline silicon thin film is crystallized, and the crystallinity of the crystal silicon is remarkably improved. The system display of the present invention can be formed even by using the thus obtained silicon thin film. This embodiment is advantageous in that the system display can be formed on an inexpensive glass substrate. That is, the manufacturing cost can be decreased.

However, the most desirable mode in practicing the present invention is to use the TFT using the silicon thin film described in the embodiment 1. It is preferable to use this embodiment only in the case where there occurs necessity to use a low heat resistance substrate such as a glass substrate.

The steps described in the embodiment 1 may be combined with the steps described in this embodiment. That is, such a structure may be adopted that after the laser annealing step, the gettering process of the catalytic element is carried out. In this case, the silicon thin film of higher crystallinity can be formed.

Embodiment 6

Figure 18A:
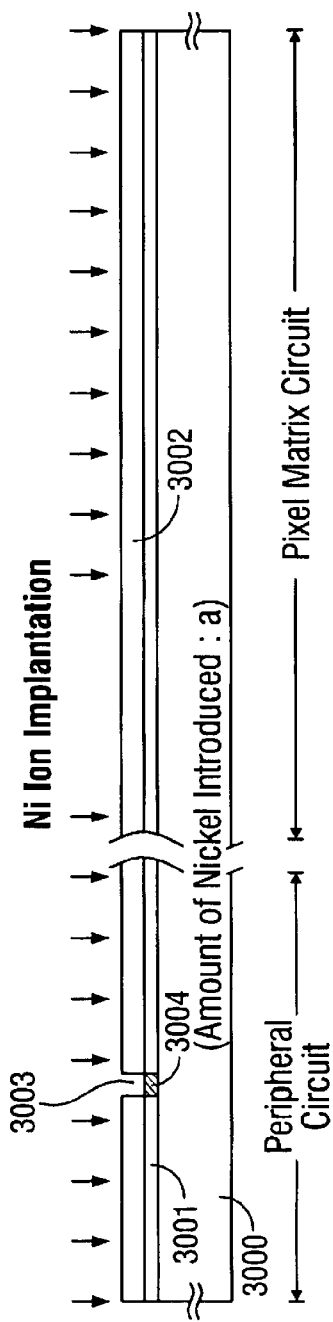
FIGS. 18A to 18C are views showing manufacturing steps of a semiconductor device.
Figure 18B:
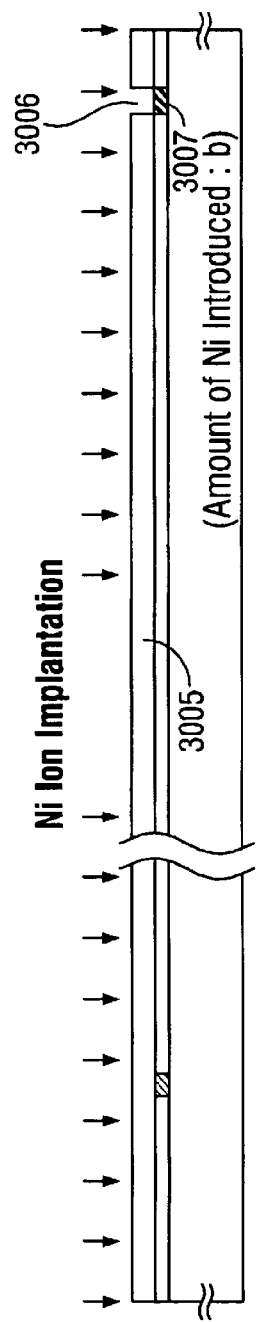
Figure 18C:
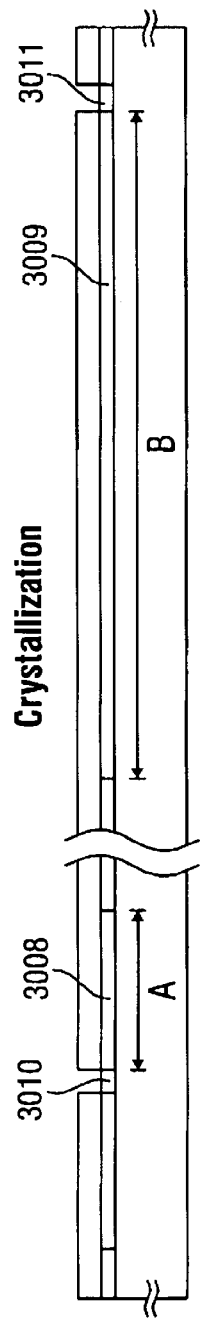

An example in which an active matrix substrate (a substrate at a side where semiconductor elements are manufactured) of a reflection type liquid crystal display device is manufactured by using the present invention, will be described with reference to FIGS. 18A to 18C.

First, as a substrate having an insulating surface, a glass substrate 3000 on which an under layer of a silicon oxide film or the like is deposited, is prepared. A quartz substrate, a silicon substrate, a ceramic substrate or the like may be used instead of the glass substrate 3000.

Next, an amorphous silicon film 3001 with a thickness of 10 to 75 nm (preferably 15 to 45 nm) is formed by using a plasma CVD method or a low pressure CVD method. An amorphous semiconductor film containing silicon, for example, $Si_xGe_{1-x}$ (0<X<1) may be used other than the amorphous silicon film.

Next, the amorphous silicon film 3001 is crystallized by using the technique disclosed in Japanese Patent Unexamined Publication No. Hei. 8-78329. The feature disclosed in the publication is to obtain a region (called lateral growth region) in which crystals grow substantially in parallel to a substrate by selectively adding a catalytic element to an amorphous silicon film.

In the publication, although solution coating is carried out as a method of adding nickel, the feature of the present invention is to add nickel by an ion implantation method.

First, a mask insulating film 3002 made of a silicon oxide film and having a thickness of 50 to 150 nm is formed on the amorphous silicon film 3001. Then the mask insulating film 3002 is patterned to provide an opening portion 3003 at a region which becomes a peripheral circuit. Although the single opening portion is shown in the drawing, a plurality of opening portion are actually formed.

Next, nickel is added by the ion implantation method (also called an ion injection method). At this time, a dosage of ion is adjusted so that it is $1 \times 10^{12}$ to $1 \times 10^{15}$ atoms/cm$^2$ (preferably, $2 \times 10^{13}$ to $2 \times 10^{14}$ atoms/cm$^2$) (FIG. 18A).

In the case where nickel is added by the ion implantation method as in this embodiment, it is sufficient that the width of the opening portion provided in the mask insulating film is about 0.25 to 2 $\mu$m. That is, it is possible to add a sufficient amount of nickel to even an opening portion formed into a minute pattern.

In this embodiment, the width of the minimum slit of the opening portion is fixed to 1.5 $\mu$m. Thus, in a subsequent ion implantation step, it is possible to change the amount of introduction of nickel in proportion to the dosage.

By this ion implantation step, a nickel added region 3004 is formed. The amount of nickel introduced in this ion implantation step in FIG. 18A will be indicated by "a".

Next, after the mask insulating film 3002 is removed, a mask insulating film 3005 is provided, and an opening portion 3006 is formed at a region which becomes a pixel matrix circuit. In this state, nickel is added by the ion implantation method, so that a nickel added region 3007 is formed. The amount of nickel introduced in this ion implantation step shown in FIG. 18B will be indicated by "b".

After the state shown in FIG. 15B is obtained, a heat treatment at a temperature of 500 to 700° C. (typically 550 to 650° C.) is carried out for 4 to 24 hours (typically 8 to 15 hours) in a nitrogen, oxygen or hydrogen atmosphere, so that the amorphous silicon film 3001 is crystallized. By this heat treatment, lateral growth regions 3008 and 3009 are obtained (FIG. 18C).

At this time, the growth distance of the lateral growth region 3008 will be indicated by "A". That is, nickel is added in the ion implantation step of FIG. 18A with such an introduction amount "a" that the growth distance "A" is realized. Also, in the lateral growth region 3009, nickel is added in the ion implantation step of FIG. 18B with such an introduction amount "b" that the growth distance "B" is realized.

The lateral growth regions 3008 and 3009 have a crystal structure in which needle-like or column-like crystals grown in substantially parallel to the substrate are grouped. Further, there is a feature that the respective needle-like crystals grow in substantially parallel to each other and macroscopically grow toward the same direction (arranged side by side with a tendency toward a specific direction). Also, it is confirmed by the SIMS (Secondary Ion Mass Spectrometry)

that the respective crystals contain nickel of about $5 \times 10^{18}$ to $1 \times 10^{19}$ atoms/cm$^3$.

Regions 3010 and 3011 added with nickel become crystallized regions containing a high concentration of nickel. Regions other than these crystallized regions 3008 to 3011 remain as noncrystalline regions (amorphous regions) which have not been crystallized.

Next, the mask insulating film 3005 is removed, and a resist mask 3012 is formed. Then openings 3013 to 3015 are formed by patterning. At this time, the opening portions 3013 and 3014 are provided on a region adjacent to an element formation portion (region which becomes an active layer of a TFT in this embodiment). This is for forming a layer containing a phosphorus element (gettering region of nickel) under the opening portions 3013 and 3014 in a later step.

The opening portion 3015 is formed on a region which becomes a lower electrode of an auxiliary capacitance in a later step. In this embodiment, a part of the active layer which is added with phosphorus to be made conductive, is used as the lower electrode of the auxiliary capacitance.

Incidentally, it is also possible to make such a structure that a necessary opening is formed by patterning the mask insulating film 3005 without newly forming the resist mask. In this case, it is also possible to use the opening portion 3006 used for the addition of nickel in a next P ion implantation step as it is.

Next, in that state, a P (phosphorus) ion is added by the ion implantation method or plasma doping method. In the doping step in this embodiment, an acceleration voltage is 5 to 25 kV, and a dosage of the ion is $1 \times 10^{13}$ to $8 \times 10^{15}$ atoms/cm$^2$ (preferably $5 \times 10^{13}$ to $1 \times 10^{15}$ atoms/cm$^2$).

By such setting, the P ion having a concentration of $5 \times 10^{19}$ to $2 \times 10^{21}$ atoms/cm$^3$ is added in P ion added regions (hereinafter referred to as phosphorus added regions) 3016 to 3018. By this step, the phosphorus added regions 3016 to 3018 are once made amorphous (FIG. 19A).

In the structure of this embodiment, the P ion added to the phosphorus added regions 3016 and 3017 is added for gettering of a catalytic element. The P ion added to the phosphorus added region 3018 is added for making the silicon film have N-type conductivity so that the film is made a lower electrode of an auxiliary capacitance.

Like this, according to this embodiment, manufacturing steps are simplified in that the region where nickel is gettered by the phosphorus element is formed, and at the same time, the N-type conductivity layer which becomes the lower electrode of the auxiliary capacitance, can be formed. Of course, also the phosphorus added region 3018 has a gettering effect of the catalytic element.

After the addition step of the P ion is ended, the resist mask 3012 is removed, and a heat treatment at a temperature of 400 to 700° C. (typically 600° C.) for 2 to 24 hours (typically 8 to 15 hours) is carried out in a nitrogen atmosphere, so that nickel remaining in the lateral growth regions 3008 and 3009 is moved to phosphorus added regions 3019 to 3021. At this time, the phosphorus added regions 3019 to 3021 are re-crystallized (FIG. 19B).

In this way, nickel remaining in the lateral growth regions 3008 and 3009 is gettered by the phosphorus added regions 3019 to 3021, and the lateral growth regions 3022 and 3023 where the concentration of nickel is lowered, are obtained. Incidentally, the gettering step of the phosphorus element is disclosed in Japanese Paten Application No. Hei. 9-94607 filed on Mar. 27, 1997 by the present inventors et al.

As a result of confirmation by the present inventors through the SIMS (Secondary Ion Mass Spectrometry), it was turned out that the concentration of nickel contained in the lateral growth regions 3022 and 3023 after the step shown in FIG. 19B is lowered down to a value at most $5 \times 10^{17}$ atoms/cm$^3$ (a value lower than this is less than the lower limit of detection so that it can not be measured).

At this time, since nickel is gettered in the phosphorus added regions 3019 to 3021 so that they become regions containing a high concentration of nickel. According to the SIMS analysis, it is confirmed that there is nickel with a concentration of $1 \times 10^{18}$ to $1 \times 10^{20}$ atoms/cm$^3$.

However, even if nickel exists in the phosphorus added region 3021 which subsequently functions as the lower electrode of the auxiliary capacitance, there is no problem if the region functions as the electrode. The phosphorus added regions 3019 and 3020 are not used for at least channel formation regions (yet they can be used as source/drain regions). Thus, since the phosphorus added regions 3019 and 3020 are basically removed at a time when an active layer is formed, the existence of nickel does not cause a problem.

After the state shown in FIG. 19B is obtained in this way, the silicon film is patterned to form active layers 3024 to 3026. The active layers 3024 and 3025 respectively become an N-type TFT and a P-type TFT of a CMOS circuit mainly constituting a peripheral circuit. The active layer 3026 becomes a pixel TFT (N-type TFT in this embodiment) constituting a pixel matrix circuit.

At the patterning, it is desirable to remove the portion which was the added region of nickel and the end portion of the lateral growth region. It is because the regions contain nickel of an extremely high concentration in the narrow regions, so that they are first etched in a subsequent etching step, and there is a possibility to pollute a liquid agent or the like.

At the patterning, since the nickel added region and ends of the lateral growth region are first etched, a step is formed in the under layer (under film or quartz substrate surface). Especially, since the step in the nickel added region is apt to become large, an attention must be paid.

Next, an oxide (not shown) formed on the surface of the silicon film is removed. Since such a surface oxide takes in contaminants and the like in the silicon film, a clean surface of the silicon film can be obtained by removing the oxide.

Then a silicon oxide film 3027 with a thickness of 10 to 150 nm which becomes a gate insulating film, is immediately formed by using a plasma CVD method. Of course, a low pressure thermal CVD method, a sputtering method or the like may be used, Also an ECR plasma CVD method or a high density plasma CVD method is effective (FIG. 19C).

Next, electrode patterns 3028 to 3031 made of aluminum or a material mainly containing aluminum are formed. The electrode patterns 3028 to 3030 are respectively originals of gate electrodes constituting the CMOS circuit or pixel TFT. The electrode pattern 3031 is an original of an upper electrode of the auxiliary capacitance (FIG. 20A).

Since a triple gate TFT is adopted as the pixel TFT in this embodiment, the electrode patterns 3030 is divided into three to be depicted, they are actually connected to each other and are the same electrode.

After the state shown in FIG. 20A is obtained in this way, two anodic oxidation steps are next carried out. Incidentally, steps described below from an anodic oxidation step to an ion (phosphorus (P) or boron B) implantation step, are based on the technique disclosed in Japanese Patent Unexamined Publication No. Hei. 7-135318 by the present inventors et al. Thus, detailed conditions and the like may be referred to the publication.

After the electrode patterns 3028 to 3031 are formed, anodic oxidation is first carried out in a solution of 3% oxalic acid to form porous anodic oxidation films 3032 to 3035. Next, anodic oxidation is carried out in an ethylene glycol solution containing 3% tartaric acid to form non-porous anodic oxidation films 3036 to 3039. After these two anodic oxidation steps, gate electrodes 3040 to 3042, and upper electrode 3043 of the auxiliary capacitance are defined.

After the state shown in FIG. 20B is obtained in this way, dry etching of the gate insulating film 3027 is carried out by using the gate electrodes and the porous anodic oxidation films as masks. By this step, gate insulating films 3044 to 3047 are formed. The gate insulating film 3047 functions as a capacitor insulating film of the auxiliary capacitance (FIG. 20C).

Next, the porous anodic oxidation films 3032 to 3035 are removed as shown in FIG. 20D, and high acceleration P ion implantation and low acceleration P ion implantation are carried out. By this step, a source region 3048, a drain region 3049, a pair of low concentration impurity regions (also called LDD regions) 3050 and a channel formation region 3051 of an N-type TFT are formed.

Also, since the pixel TFT is constituted by the N-type TFT, a source region 3052, a drain region 3053, a pair of low concentration impurity regions 3054 to 3056 and channel formation regions 3057 to 3059 of the pixel TFT are formed.

At this time, a P ion is also added into the active layer of a P-type TFT, so that there are formed regions 3060 and 3061 containing the P ion of a concentration comparable to the above source/drain regions, and a region 3062 containing the P ion of a concentration comparable to the above low concentration impurity regions. The P ion is not added into a region 3063 so that the concentration of the P ion added in advance is maintained. However, the region is actually united with the pixel TFT and the drain region 3053.

Figure 21A:
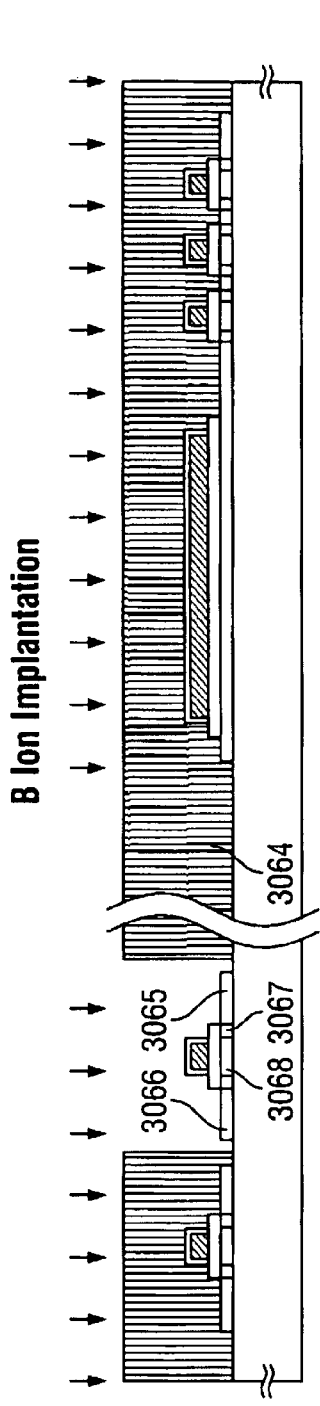
FIGS. 21A to 21C are views showing manufacturing steps of a semiconductor device.

Next, a resist mask 3064 is provided so that only a P-type TFT is exposed, and high acceleration B ion implantation and low acceleration B ion implantation are carried out. By this step, all the regions 3060 to 3062 containing the P ion in FIG. 20D are inverted into a P-type, so that a source region 3065, a drain region 3066, a pair of low concentration impurity regions 3067, and a channel formation region 3068 of the P-type TFT are formed (FIG. 21A).

When the above ion implantation steps are used, it is possible to form the source/drain regions of the N-type TFT and the P-type TFT by only one patterning step.

Next, in the state where the resist mask 3064 is removed, activation of the implanted P ion and B ion is carried out by any one means of furnace annealing, laser annealing and lamp annealing, or by a combination of those means. At the same time as the activation, the crystallinity of the active layer disordered by the ion implantation is repaired.

Figure 21B:
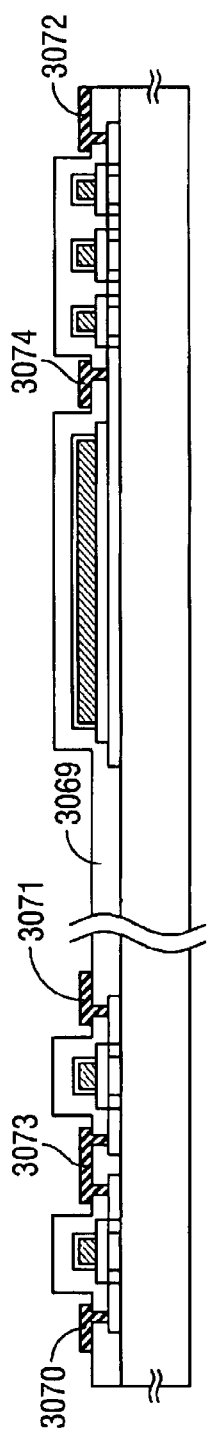

Next, a lamination film made of a silicon oxide film and a silicon nitride film is formed as a first interlayer insulating film 3069. After contact holes are formed, source electrodes 3070 to 3072, and drain electrodes 3073 and 3074 are formed (FIG. 21B).

Next, as a second interlayer insulating film 3075, an organic resin film (polyimide, polyamide, polyimide amide, acryl, etc.) with a thickness of 0.5 to 3 $\mu$m (preferably 1.5 to 2.5 $\mu$m) is formed. The most remarkable feature of the organic resin film is that the relative dielectric constant is low (about 2.0 to 3.4). By this, the parasitic capacitance between wiring lines can be greatly decreased. That is, lowering of an operating speed can be effectively suppressed when a circuit requiring high frequency driving, such as a logic circuit, is formed.

Next, a contact hole is formed in the second interlayer insulating film 3075 and a pixel electrode 3076 is formed. In this embodiment, the pixel electrode 3076 is made of aluminum or a material mainly containing aluminum.

Figure 21C:
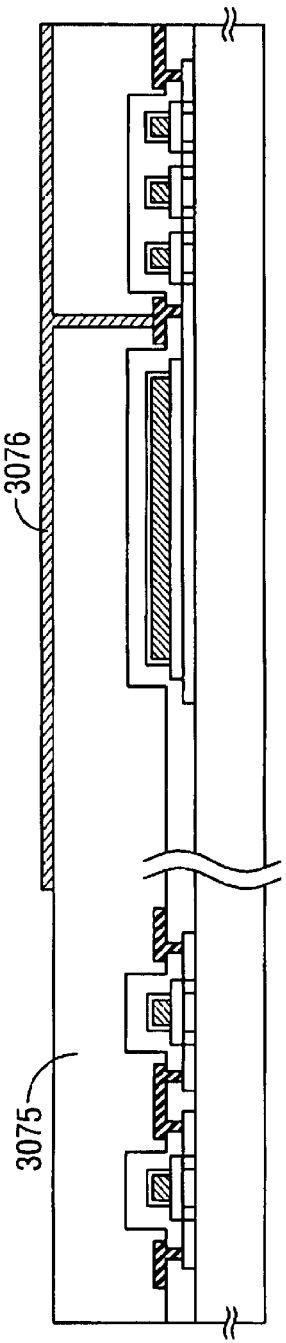

Finally, the entire of the obtained TFT is hydrogenated by a heat treatment in a hydrogen atmosphere to decrease dangling bonds in the active layer. In this way, the active matrix substrate in which the CMOS circuit and the pixel TFT are integrally formed on the same substrate as shown in FIG. 21C, is completed.

Thereafter, if a liquid crystal layer is held between the above active matrix substrate and an opposite substrate by a well-known cell assembling step, the reflection type liquid crystal display device is completed.

Design items such as the kind of a liquid crystal material or a cell gap may be suitably determined by an operator. Although this embodiment adopts such a structure that the black mask is provided at an opposite side, the structure may be modified so that the black mask is disposed at a necessary portion at the side of the active matrix substrate.

In this embodiment, there is great meaning in that the growth distances of the lateral growth regions are made different from each other.

For example, in a lateral growth region, there is a case where crystallinity is subtly different according to the position even in the same region. In such a case, if a plurality of TFTs are formed in one lateral growth region, there can be a case where electrical characteristics are different between two separate TFTs.

However, such a subtle difference of characteristics become problematic in a circuit processing an analog signal or a circuit for a high frequency driving. Thus, it is necessary to form a group of TFTs having little difference of characteristics by forming lateral growth regions with necessary distances at necessary portions.

The present invention is an extremely effective technique for such a demand. Further, since an occupied area of the added region of the catalytic element can be extremely decreased by using the ion implantation method, the freedom of circuit design is greatly improved.

Thus, in view of the trend of a future semiconductor circuit, it appears that the present invention is extremely effective for a high frequency circuit and the like which is formed by ultra fine processing and has a very high operation speed.

Embodiment 7

Although aluminum or a material mainly containing aluminum is used for a gate electrode in the embodiment 1 or embodiment 6, a crystalline silicon film having one conductivity may be used for the gate electrode.

Also, a metal material such as titanium, tantalum, tungsten or molybdenum, a metal silicide of a compound of the metal material and silicon, or the like may be used for the gate electrode.

Embodiment 8

In this embodiment, an example in which a growth distance of a lateral growth region is controlled by controlling an amount of introduction of a catalytic element (nickel) by a means different from the embodiment 6, will be described.

In FIG. 22A, 3100 denotes a glass substrate on which an under film is provided, and 3101 denotes an amorphous silicon film. A mask insulating film 3102 is formed, and then opening portions 3103 and 3104 are formed.

At this time, the amount of introduction of nickel is controlled by changing the minimum slit width of the opening portions. In this embodiment, the minimum slit width of a peripheral circuit will be indicated by "a'", and the minimum slit width of a pixel matrix circuit will be indicated by "b'".

In this state, nickel is implanted by an ion implantation method. The condition of implantation may be the same as the embodiment 1. In this embodiment, the ion implantation of nickel is carried out at an acceleration voltage of 10 kV and a dosage of $2 \times 10^{14}$ atoms/cm$^2$ (FIG. 22A).

At this time, since the ion implantation step is carried out at the same time, the concentrations of nickel added to the opening portions 3103 and 3104 are equal to each other. However, the amounts of introduction of nickel in nickel added regions 3105 and 3106 formed by this ion implantation step are different in accordance with the minimum slit widths of the opening portions 3103 and 3104.

After the state shown in FIG. 22A is obtained, a heat treatment under the same condition as the embodiment 1 is carried out to crystallize the amorphous silicon film 3102. In this embodiment, the crystallization step is carried out by the heat treatment at 570° C. for 14 hours (FIG. 22B).

Lateral growth regions 3107 and 3108 are formed by this crystallization step. At this time, the growth distance of the lateral growth region 3107 will be indicated by "A'", and the growth distance of the lateral growth region 3108 will be indicated by "B'". In this embodiment, design is made to establish the relation of B'>A'.

In this embodiment, the minimum slit width "a'" is determined so that the growth distance of the lateral growth region 3107 after crystallization becomes "A'", and the minimum slit width "b'" is determined so that the growth distance of the lateral growth region 3108 becomes "B'". For that purpose, it is necessary to obtain the relation between the minimum slit width and the growth distance in advance in the case of the ion implantation condition (10 kV, $2 \times 10^{14}$ atoms/cm$^2$) of the embodiment.

In the case where the ion implantation step is carried out at the same time as in this embodiment, since the concentration of addition of nickel is uniform over the entire surface of the substrate, the control of the minimum slit width leads to the control of the amount of introduction of nickel and further to the control of the growth distance of the lateral growth region. Steps subsequent thereto may be in accordance with the embodiment 1.

Also, when such a structure as this embodiment is adopted, when a P ion implantation step as shown in FIG. 19A is subsequently carried out, phosphorus can be added using the mask insulating film 3102 as a mask as it is. Thus, it becomes unnecessary to provide a resist mask, and one patterning step is omitted so that the manufacturing process can be simplified.

Embodiment 9

Although a planar type TFT is shown as an example of a typical TFT structure in the embodiments 1 to 4 or embodiment 6, also a bottom gate type TFT such as a reverse stagger type TFT may be used in the present invention.

Like this, the present invention can be applied irrespective of the structure of a semiconductor element (semiconductor device), and is not limited to a semiconductor element of a specific structure.

Embodiment 10

In this embodiment, an example in which an ion implantation step of a catalytic element (nickel) is carried out through a structure different from the embodiment 6, will be described.

In FIG. 23, 3400 denotes a glass substrate, 3401 is an under film, 3402 denotes an amorphous silicon film, 3403 denotes a buffer layer made of a silicon oxide film or the like, and 3404 denotes a resist mask having an opening portion. The buffer layer 3403 may be formed by a vapor phase method such as a plasma CVD method, and in some cases, it may be formed by simple oxidation means such as thermal oxidation or UV oxidation.

The feature of this embodiment is not to directly implant a catalytic element to an amorphous silicon film 3402 but to implant the catalytic element through a buffer layer 3403. At this time, it is needless to say that the ion profile at the ion implantation is adjusted so that the peak value is located within the amorphous silicon film 3402.

Even in the structure of this embodiment, nickel added regions 3405 and 3406 can be formed in the amorphous silicon film 3402 by optimizing the ion implantation condition. According to the structure of this embodiment, since damage at the ion implantation does not directly reach the amorphous silicon film 3402, it is possible to avoid the bad influence due to the damage. Also, it is possible to prevent impurity elements (elements contained in an atmosphere and the like) other than the catalytic element from being concurrently implanted at the ion implantation.

Also, the structure that the amorphous silicon film 3402 and the buffer layer 3403 are continuously formed by a plasma CVD method, is effective. In such a structure, there occurs no case where impurities adhere to the surface of the amorphous silicon film 3402 and are concurrently implanted at the ion implantation.

It is also possible to carry out an ion implantation step in which the structure of this embodiment is combined with the structure of the embodiment 1 or 6.

Embodiment 11

Although the ion implantation method is used as a means for adding a P ion in the embodiment 1 or 6, an example of using a vapor phase method will be described in this embodiment.

In this embodiment, in the state in which an insulating film is provided at a necessary portion on the surface of an amorphous silicon film, a thin film containing phosphorus is formed by a plasma CVD method. This thin film may be formed by adding a gas of phosphine ($PH_3$) or the like into a film forming gas.

By this, the region where the thin film has been formed, functions as a gettering region at the time of a gettering step (heat treatment) by the phosphorus element.

Embodiment 12

In this embodiment, an example in which a liquid phase method is used as a method of adding a P ion, will be described. Specifically, a thin film typified by PSG (phosphorus silicate glass) is formed by solution coating.

Also in this case, in the state where an insulating layer is provided at a necessary portion on an amorphous silicon film, a solution as a raw material of PSG is coated, and spin coating is carried out, so that a thin film containing phosphorus is formed. Even by such a method, a gettering region can be formed.

Embodiment 13

In this embodiment, an example in which a gettering step by a halogen element is carried out instead of carrying out the gettering step by the phosphorus element in the embodiment 6, will be described. Like reference numerals to the embodiment 1 will be used according to necessity.

Figure 24A:
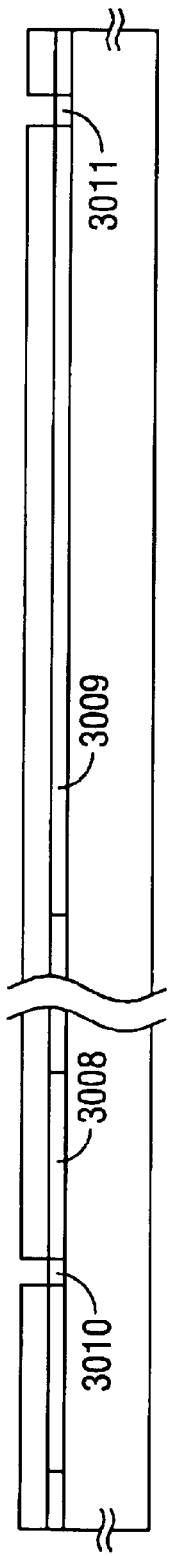
FIGS. 24A to 24C are views showing manufacturing steps of a semiconductor device.

First, in accordance with the steps of the embodiment 1, the state shown in FIG. 24A is obtained. This state corresponds to the state of FIG. 18C in the embodiment 1.

Figure 24B:
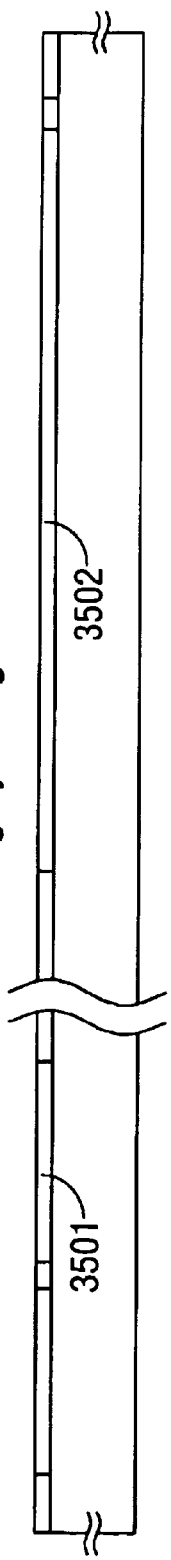
Figure 24C:
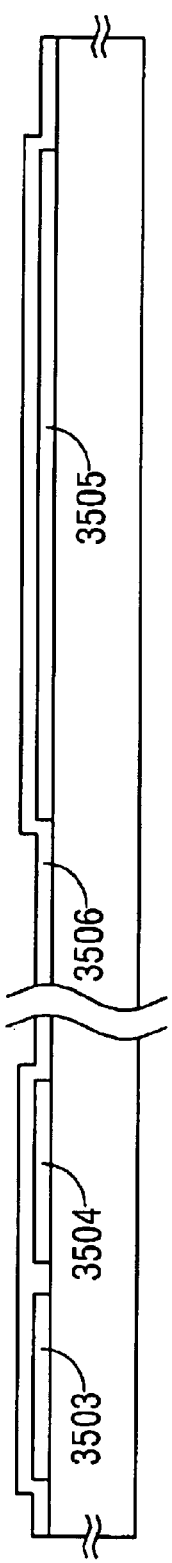

Next, after the state of FIG. 24C is obtained, a heat treatment is carried out in an atmosphere containing a halogen element. In this embodiment, hydrogen chloride (HCl) of 0.5 to 10 vol % (typically 3 vol %) is contained in an oxygen ($O_2$) atmosphere (FIG. 24B).

One kind or plural kinds of compounds containing halogen, selected from the group comprised of HF, $NF_3$, HBr, $Cl_2$, $ClF_3$, $BCl_3$, $F_2$, $Br_2$ and the like may be used other than HCl. Also, a hydride of halogen may be used.

It is preferable to carry out the heat treatment at a temperature exceeding 700° C. to effectively carry out the gettering of nickel by chlorine. The temperature is typically 800 to 1,000° C. (950° C. in this embodiment). Nickel is thoroughly removed or lowered from the entire of the crystalline silicon film by this treatment.

As a result of the SIMS (Secondary Ion Mass Spectrometry) by the present inventors, it was turned out that the concentration of nickel contained in the lateral growth regions 3501 and 3502 after the step shown in FIG. 24B was lowered down to a value at most $5 \times 10^{17}$ atoms/cm$^3$ (a value lower than this is under the lower limit of detection so that it can not be measured).

Further, a halogen element is taken in the inside of the lateral growth region by this heat treatment. Thus, there is a halogen element with a concentration of $1 \times 10^{15}$ to $1 \times 10^{20}$ atoms/cm$^3$ in the final active layer (lateral growth region).

As a result of analyzing the lateral growth regions 3501 and 3502 through a TEM (Transmission Electron Microscope) by the present inventors, it was confirmed that the regions have a crystal structure in which a plurality of rod-like or flattened rod-like crystals arranged side by side with tendency toward a specific direction, are grouped.

The feature of this crystal structure is almost equal to the feature of the above-mentioned lateral growth region. However, by various analyses by the present inventors, it is inferred that lattices are continuous in the boundary (crystal grain boundary) between the respective rod-like crystals (which may be said as needle-like crystals) so that the boundary is very excellent in consistency (conformity) and is electrically inactive.

The proof is that a TFT having an active layer of a crystalline silicon film having such a crystal structure has electrical characteristics superior to a MOSFET formed on single crystal silicon. The details of the crystal structure are disclosed in Japanese Patent Application No. Hei. 8-335152 filed on Nov. 29, 1996.

After the state shown in FIG. 24B is obtained in this way, the silicon film is patterned to form active layers 3503 to 3505. The active layers 3503 and 3504 respectively become an N-type TFT and P-type TFT of a CMOS circuit mainly constituting a peripheral circuit. The active layer 3505 becomes a pixel TFT constituting a pixel matrix circuit.

Next, a silicon oxide film 3506 with a thickness of 10 to 150 nm, which becomes a gate insulating film, is formed by using a plasma CVD method, and a heat treatment at a temperature exceeding 700° C. is again carried out. At this time, it is preferable that an atmosphere of the treatment is made an atmosphere containing a halogen element as described before. In that case, the condition may be the same as the above-described condition (FIG. 24C).

Also, at the end of the heat treatment, it is effective to add a heat treatment in an inert gas atmosphere to improve the film quality of the gate insulating film 3506.

It is expected that nickel remaining in the active layer is further removed by this heat treatment. Also, a thermal oxidation film is formed at interfaces between the active layers 3503 to 3505 and the gate insulating film 3506, and superior interfaces between the active layers and the gate insulating film, which have few interfacial levels or the like, can be obtained. Thereafter, a semiconductor device may be manufactured in accordance with the similar steps to the embodiment 6.

Embodiment 14

In the present invention, other than the ion implantation method as described in FIG. 2, such a method may be used that a catalytic element is directly added into an amorphous silicon film without using a resist mask, which forms another embodiment.

For that means, there is a technique such as an FIB (Focussed Ion Beam) method in which an ion can be radiated to only a minute spot. According to such a technique, a pattern is directly depicted by a converged ion beam containing a catalytic element, so that an added region of the catalytic element with a desired shape can be formed at a desired position.

According to this embodiment, a step of forming a resist mask and a step of patterning can be simplified, so that the manufacturing cost can be decreased, and the yield can be improved.

Embodiment 15

In this embodiment, some examples as to the combination of the interlayer insulating films (first to third) shown in the embodiment 2 will be described.

First, in FIG. 7D, polyimide is used for the first interlayer insulating film 557 as an under layer of the wiring lines 558 to 562 mainly containing aluminum and for the second interlayer insulating film 563 as an under layer of the black mask 564 made of titanium film. Acryl is used for the third interlayer insulating film 565 as an under layer of the pixel electrode 566.

Under the experimental conditions by the present inventors, since the film growth temperature (300° C.) of the wiring lines 558 to 562 and the black mask 564 is slightly higher than the heat-resistant temperature (200° C.) of acryl, it is preferable to use polyimide (heat-resistant temperature is about 350 to 400° C.) capable of withstanding the film growth temperature as an under layer. Since the pixel electrode 566 is formed at a room temperature, acryl having low heat resistance can be used as an under layer. However, this structure is limited to the case where the pixel electrode 566 is made of a material (such a material that a film can be formed at a temperature lower than the heat-resistant temperature of acryl) having low film growth temperature, such as ITO.

Such a structure has the following advantages.

(1) Since acryl is photosensitive, it can be directly patterned without using a resist mask, so that the manufacturing steps can be simplified.

(2) Since acryl is less expensive than polyimide, the manufacturing cost can be reduced.

(3) The adhesiveness between ITO and acryl is better than that between ITO and polyimide.

(4) Since acryl is superior in flatness, an electric field applied to the pixel electrode can be made uniform.

As other examples, all interlayer insulating films can be made of polyimide, or all interlayer insulating films can be made of acryl. However, in the case where all the interlayer insulating films are made of acryl, it is a precondition that steps carried out after the film formation of acryl are made at a temperature lower than the heat-resistant temperature of acryl.

Embodiment 16

The present invention can be applied to any semiconductor devices, and any semiconductor devices are contained in the range of application of the present invention as long as circuits are formed by using TFTs on a substrate having an insulating surface. Such semiconductor devices include a device functioning as only a logic circuit, such as an IC and a VLSI, and a device functioning as a display such as an active matrix type electro-optical device.

Especially, as the active matrix type electro-optical device, by using the system display including a built-in logic circuit as shown in FIG. 1, the present invention can be applied to an active matrix type liquid crystal display device, an active matrix type EL display device, an active matrix type EC display device, and the like.

These active matrix type display devices are roughly divided into a transmission type display device and a reflection type display device. For example, the transmission type liquid crystal display device is such a device that a back light is disposed at the back side of an active matrix substrate (substrate on which TFTs are disposed) and an image is recognized by seeing light being transmitted through a display unit. The reflection type liquid crystal display device is such a device that incident light from the surface side of an active matrix substrate is reflected by pixel electrodes disposed on the active matrix substrate and an image is recognized by seeing the reflected light.

Although there is no large difference in the structure of a TFT between the transmission type display device and the reflection type display device, we can see a feature in that materials forming pixel electrodes are different therebetween. For example, in the case where the transmission type display device is fabricated, it is sufficient to use a transparent electrode of ITO or the like as the pixel electrode 1411 in FIG. 14A. In the case where the reflection type display device is fabricated, it is sufficient to use an opaque electrode having a high reflectance as the pixel electrode 1411.

In this way, by slightly changing the structure of the TFT, the present invention can be applied both the transmission type display device and the reflection type display device. Especially, since an aperture ratio does not make a problem for the reflection type display device, it has an advantage that the freedom of design is wider than the transmission type display device. For example, in the transmission type liquid crystal display device, a pixel region is almost constituted by a window portion through which light is transmitted, like the image display region 1414. On the other hand, in the reflection type liquid crystal display device, since other circuit can be formed on the back side of such an image display region, the degree of integration can be further increased.

Embodiment 17

Figure 25:
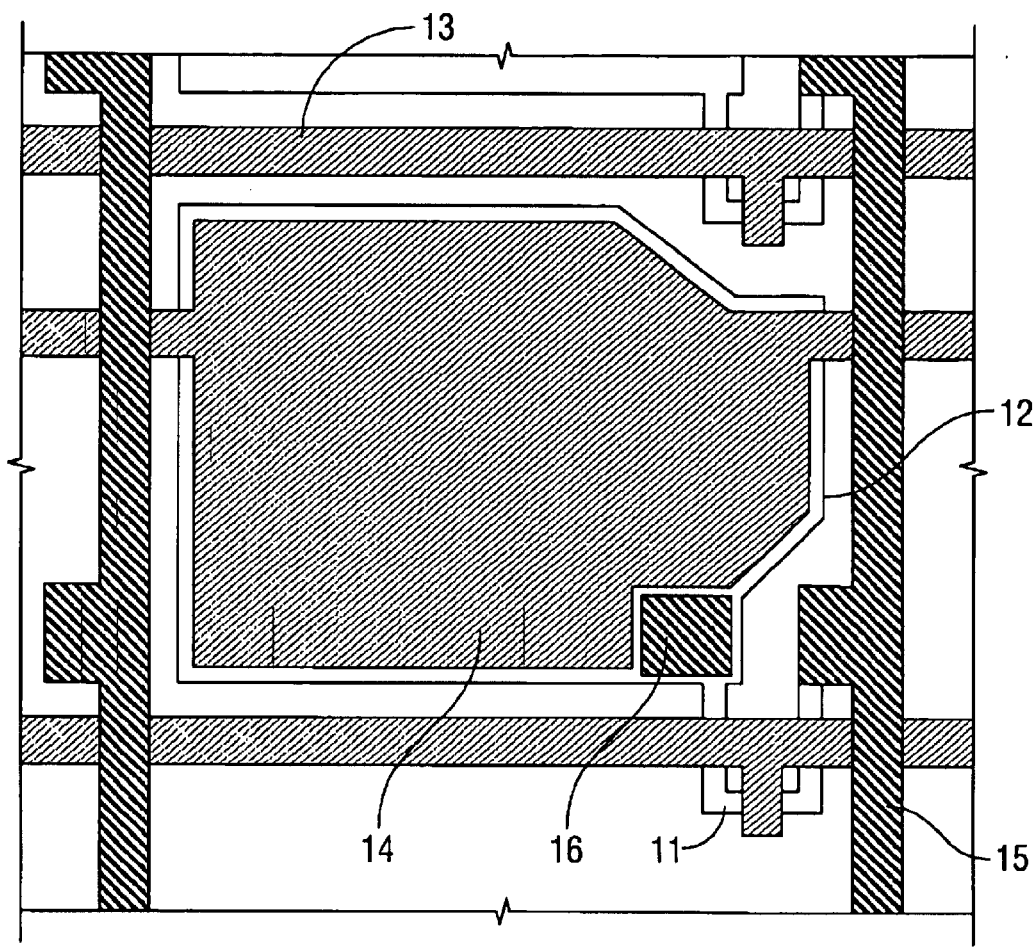
FIG. 25 is a view showing the structure of a pixel region.

In this embodiment, an example of a pixel structure constituting a pixel matrix circuit is shown in FIG. 25. However, a pixel electrode is omitted to simplify the structure.

In FIG. 25, 11 denotes an active layer, which corresponds to the active layer 3026 in FIG. 19C. In this embodiment, the active layer 11 at the drain side is formed to extend in all the pixel, and this embodiment has a feature that the active layer serves as also a lower electrode 12 of an auxiliary capacitance.

A gate line 13 is disposed thereon through a gate insulating film. The gate line 13 corresponds to the gate electrode 3042 in FIG. 20B. Also, an upper electrode 14 of the auxiliary capacitance is formed other than the gate line 13. The upper electrode 14 corresponds to the upper electrode 3043 in FIG. 20B.

In this case, the upper electrode 14 is disposed to have a shape almost consistent with the active layer which becomes the lower electrode, and forms an auxiliary capacitance corresponding to almost an occupied area of the pixel. The upper electrodes 14 in adjacent pixels are electrically connected to each other (the upper electrode is connected in parallel to the gate line so as not to cross the gate line). That is, the upper electrodes of the auxiliary capacitances in all pixels are kept at the same potential.

Next, a source electrode (source line) 15 and a drain electrode 16 are formed on the gate line 13 and the upper electrode 14 of the auxiliary capacitance through a first interlayer insulating film. These electrodes correspond to the source electrode 3072 and the drain electrode 3074 in FIG. 21B.

Although not shown, as shown in FIG. 21C, if the interlayer insulating film 3075 and the pixel electrode 3076 are formed and a well-known cell assembling step is carried out, a reflection type liquid crystal display device is completed. When the structure as in this embodiment is adopted, even if a pixel area becomes small, it is possible to secure an auxiliary capacitance using the area to the maximum.

If the structure as in the embodiment is made to correspond to XGA, it is very difficult to form an active layer of a TFT arranged in a pixel matrix circuit by a lateral growth region. It is because a pixel size in the XGA is small to be about 30 μm square, so that if a large nickel added region is formed by a conventional method, it becomes impossible to form a lower electrode forming the auxiliary capacitance by removing the added region.

However, in the present invention, since a means for providing a nickel added region under the source electrode 15 and the like, is contrived, the above-mentioned problem does not occur.

Embodiment 18

Figure 26A:
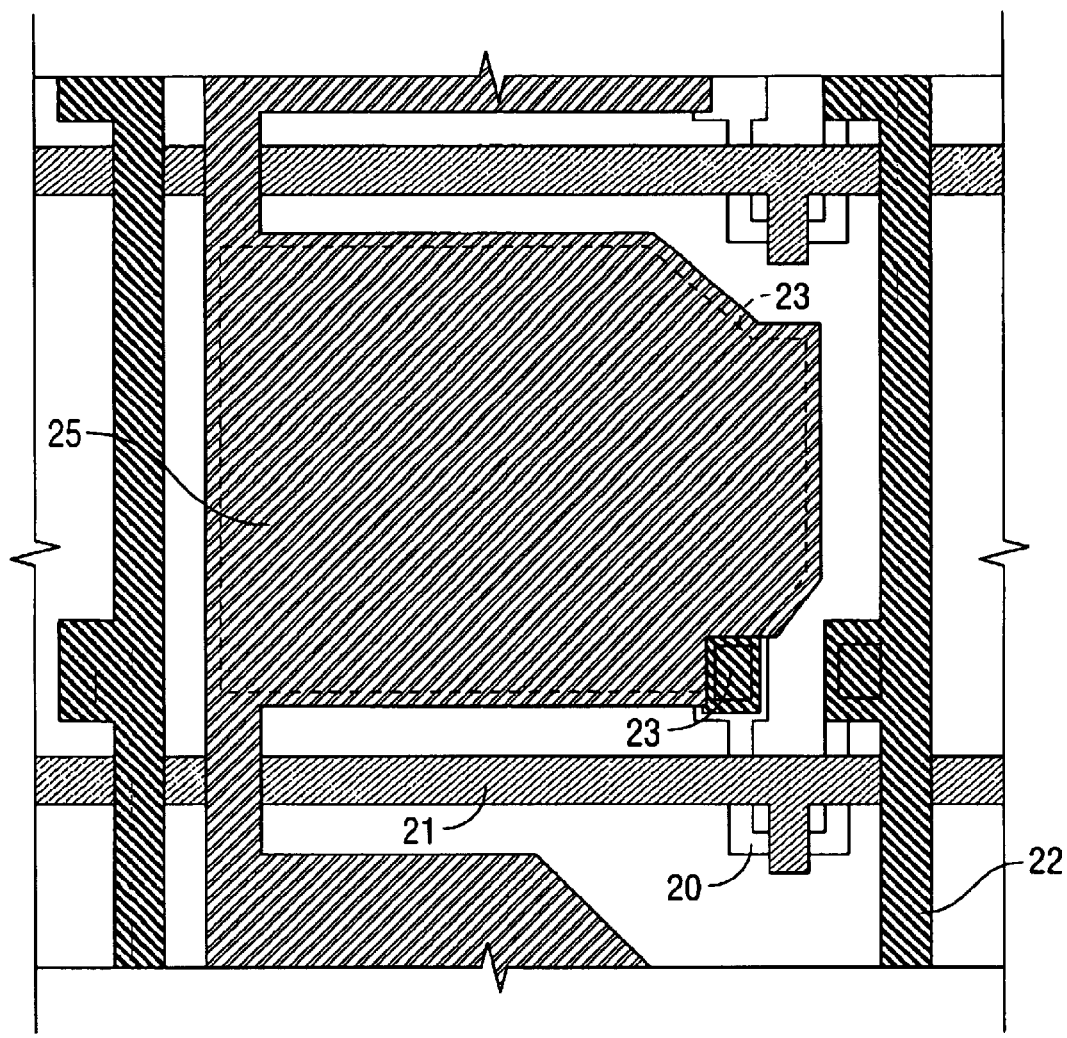
FIGS. 26A and 26B are a top view and a sectional view showing a semiconductor device applied to a reflection type liquid crystal display device.

In this embodiment, an example in which the present invention is applied to a reflection type liquid crystal display device different from the embodiment 13, will be described. FIG. 26A is a top view of the device (however, an opposite substrate, a liquid crystal layer, and a pixel electrode are omitted), and FIG. 26B is a sectional view thereof.

Figure 26B:
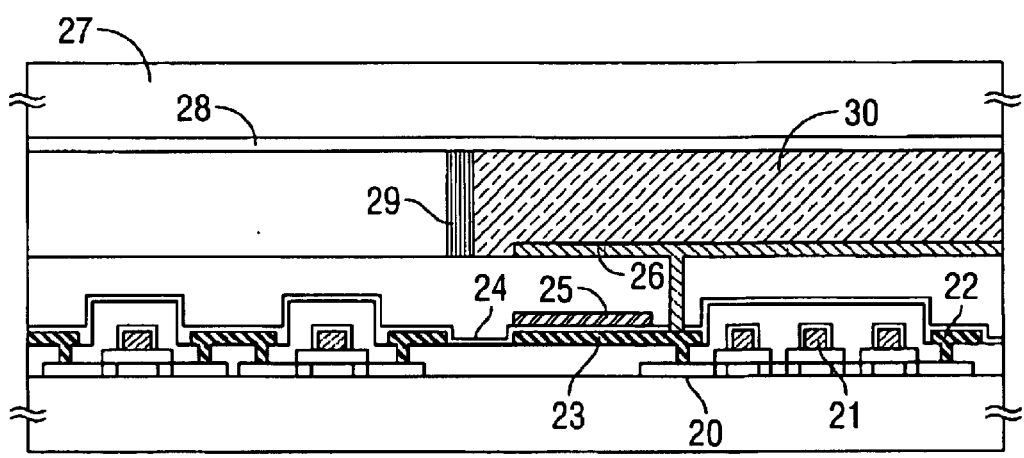

In FIGS. 26A and 26B, 20 denotes an active layer, 21 denotes a gate electrode (gate line), 22 denotes a source electrode (source line), and 23 denotes a drain electrode. At this time, the drain electrode 23 is formed to be rather large (region indicated by a dotted line) so that the electrode extends over the entire surface of the pixel region. This drain electrode 23 functions as a lower electrode of an auxiliary capacitance.

A silicon nitride film 24 (see FIG. 26B) is formed on the drain electrode, and a titanium film 25 is disposed on the silicon nitride film. The titanium film 25 functions as an upper electrode of the auxiliary capacitance, and the silicon nitride film 24 is held by the drain electrode 23 and the titanium film 25 to form the auxiliary capacitance.

Actually, as shown in FIG. 26B, a pixel electrode 26 is formed to conceal the entire of the pixel. Then an orientation film (not shown) is formed thereon. Here, they are collectively called an active matrix substrate.

Further, as shown in FIG. 26B, an opposite substrate in which a transparent conductive film 28 and an orientation film (not shown) are formed on a transparent substrate 27, is prepared. A color filter, a black mask and the like may be provided on the opposite substrate in accordance with necessity.

A liquid crystal layer 30 in the state that it is sealed in a sealing material 29, is held between the opposite substrate and the active matrix substrate. The material of a liquid crystal may be suitably changed according to a driving mode of a liquid crystal such as an ECB mode or a guest host mode.

In this embodiment, the liquid crystal layer is not disposed over a peripheral circuit to prevent parasitic capacitance from being formed between the peripheral circuit and the transparent conductive film 28 at the opposite substrate side. Of course, the present invention is applicable to the structure that the liquid crystal layer is arranged over the entire surface of the substrate.

In the embodiments 13 and 7, although an example constituting a reflection type liquid crystal display device has been described, it is needless to say that the present invention can be applied to a transmission type liquid crystal display device.

Since the present invention has an effect that the freedom of circuit design is widened, it is very effective in improving an aperture ratio of the transmission type display device.

The present invention can also be applied to an electro-optical device other than a liquid crystal display device. Such an electro-optical device includes an EL (Electroluminescence) display device, an EC (Electrochromatics) display device and the like.

Embodiment 19

In this embodiment, applied products using the electro-optical device as shown in the embodiment 8 as an example to which the present invention can be applied, will be described with reference to FIGS. 16A to 16E.

Semiconductor devices using the present invention include a (digital) video camera, a (digital) still camera, a head mount display, a car navigation system, a personal computer, a portable information terminal (mobile computer, portable telephone, etc.) and the like.

Figure 16A:
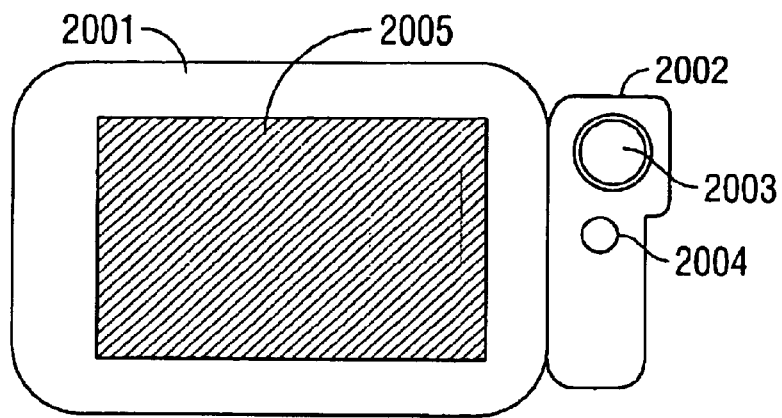
FIGS. 16A to 16E are views showing applied products.

FIG. 16A shows a mobile computer, which is constituted by a main body 2001, a camera portion 2002, an image receiving portion 2003, an operation switch 2004, and a display device 2005. When the present invention is applied to the display device 2005 to integrate a display controller circuit, an arithmetic circuit and the like, a card type mobile computer can be realized.

Figure 16B:
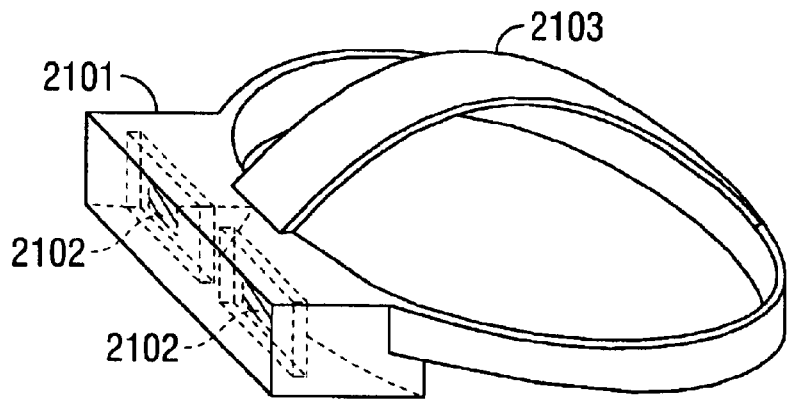

FIG. 16B shows a head mount display, which is constituted by a main body 2101, a display device 2102, and a band portion 2103. When the present invention is applied to the display device 2102, the device can be greatly miniaturized.

Figure 16C:
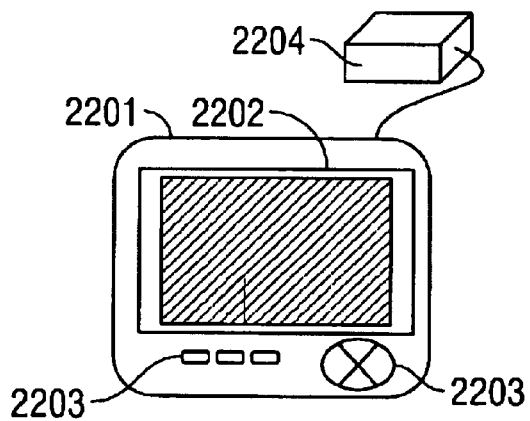

FIG. 16C shows a car navigation system, which is constituted by a main body 2201, a display device 2202, an operation switch 2203, and an antenna 2204. Since information from a satellite is transmitted to the car navigation system, a circuit for an extremely high driving frequency is necessary for signal processing. When the present invention is applied to the display device 2202, it is possible to further miniaturize the car navigation system and to lower the cost.

Figure 16D:
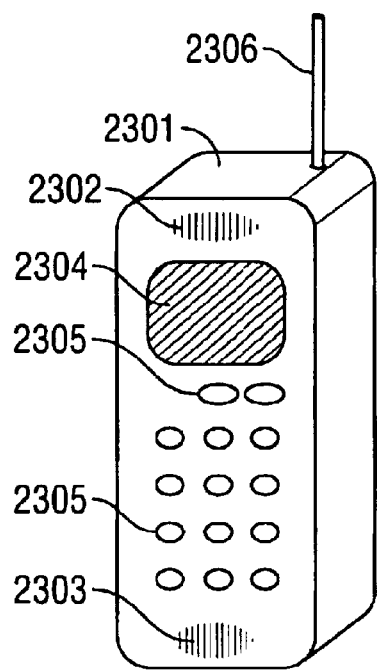

FIG. 16D shows a portable telephone, which is constituted by a main body 2301, an audio (voice) output portion 2302, an audio (voice) input portion 2303, a display device 2304, an operation switch 2305, and an antenna 2306. When the present invention is applied to the display device 2304, a digital display monitor can be mounted.

Figure 16E:
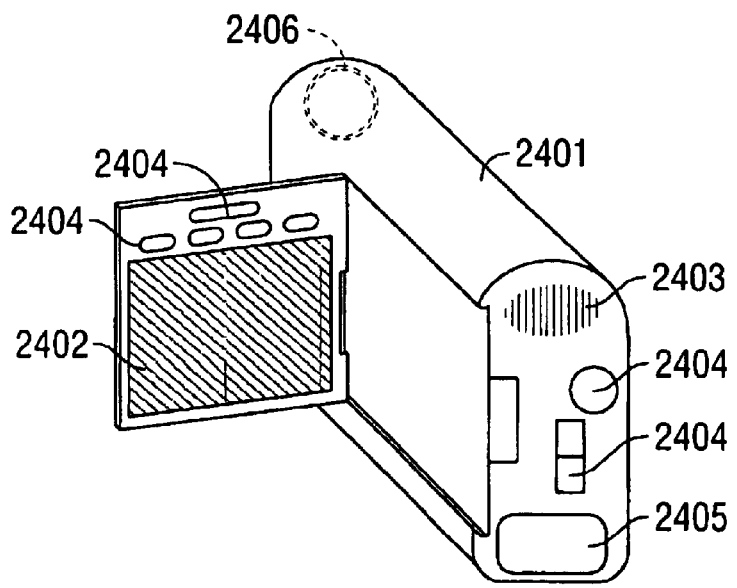

FIG. 16E shows a video camera, which is constituted by a main body 2401, a display device 2402, an audio (voice) input portion 2403, an operation switch 2404, a battery 2405, and an image receiving portion 2406. When the present invention is applied to the display device 2402, the device structure is greatly simplified, so that an extremely miniaturized device can be realized.

As described above, the application range of the present invention is extremely wide, and the present invention can be applied to display mediums of any fields. Since the application of the present invention enables the active matrix display itself to have various functions, the size of the electro-optical device can be extremely miniaturized. In future, portable electro-optical devices made into cards can be obtained by the system display.

The extremely important structure of the first invention in practicing the present invention is to obtain a silicon thin film having an extremely unique crystal structure body by carrying out a gettering process of a catalytic element with a halogen element with respect to a crystalline silicon film which has been crystallized by using the catalytic element.

A TFT using a silicon thin film formed through the manufacturing steps described in the embodiment 2 has a feature that it has a subthreshold coefficient comparable to a MOSFET using single crystal silicon and high field effect mobility. The silicon thin film of the crystal structure body made of a group of a plurality of rod-shaped or flattened rod-shaped crystals has an effect to suppress the short channel effect by itself, and even if a TFT is made minute, the characteristics of high withstand voltage and high speed operation can be realized without using a channel doping method or the like.

By using the TFT having such extremely high performance, that is, having wide ranges of a driving frequency and an operating voltage, it becomes possible to form both a high frequency driving TFT and a high withstand voltage driving TFT on the same substrate.

The structure of the second invention is to form a lateral growth region having a desired growth distance at a desired position by using an ion implantation method as a method of adding a catalytic element. By this technique, even in the case where a circuit is constituted by an extremely minute TFT having a channel length (gate length) of 0.25 to 0.7 $\mu$m, a lateral growth region having a suitable size in accordance with the circuit arrangement can be formed, so that it is possible to easily uniform the device characteristics.

Since the above described effects can be obtained, it is possible to form a semiconductor device in which a logic circuit is formed of TFTs on a substrate having an insulating surface. Also, it is possible to realize even a semiconductor device with a built-in logic circuit including the logic circuit, a driver circuit, and a pixel matrix circuit, in which both a high frequency driving TFT and a high withstand voltage driving TFT are mounted on the same substrate.

Since the semiconductor device of the present invention carries a display control circuit, a memory circuit, and a logic circuit which can ultimately include an arithmetic circuit, in addition to a pixel matrix circuit and a driver circuit, it functions as a system display superior in multi-function and portability. Further, the high frequency driving circuit is designed so that an operating voltage does not become larger than necessity, so that it is superior in the low consumption of electric power.

Further, when such a semiconductor device is applied to, for example, a liquid crystal display device or an applied product using the display device as a display monitor, it is possible to provide an extremely small, light weight, and inexpensive product.

What is claimed is:

1. A phase comparator comprising:
   a semiconductor film provided over a silicon wafer and comprising a source region, a drain region and a channel formation region provided between said source region and said drain region; and
   a gate electrode provided adjacent to said channel formation region with a gate insulating film therebetween,
   wherein lattices are continuously connected to each other at grain boundary of said semiconductor film according to high resolution TEM.

2. A phase comparator according to claim 1 wherein said phase comparator is incorporated into at least one of a video camera, a still camera, a head mount display, a car navigation system, a personal computer, a portable information terminal, a system display, a mobile computer and a portable telephone.

3. A low pass filter comprising:
   a semiconductor film provided over a silicon wafer and comprising a source region, a drain region and a channel formation region provided between said source region and said drain region; and
   a gate electrode provided adjacent to said channel formation region with a gate insulating film therebetween,
   wherein lattices are continuously connected to each other at grain boundary of said semiconductor film according to high resolution TEM.

4. A low pass filter according to claim 3 wherein said low pass filter is incorporated into at least one of a video camera, a still camera, a head mount display, a car navigation system, a personal computer, a portable information terminal, a system display, a mobile computer and a portable telephone.

5. A voltage controlled oscillator comprising:
   a semiconductor film provided over a silicon wafer and comprising a source region, a drain region and a channel formation region provided between said source region and said drain region; and
   a gate electrode provided adjacent to said channel formation region with a gate insulating film therebetween,
   wherein lattices are continuously connected to each other at grain boundary of said semiconductor film according to high resolution TEM.

6. A voltage controlled oscillator according to claim 5 wherein said voltage controlled oscillator is incorporated into at least one of a video camera, a still camera, a head mount display, a car navigation system, a personal computer, a portable information terminal, a system display, a mobile computer and a portable telephone.

7. A frequency divider comprising:
   a semiconductor film provided over a silicon wafer and comprising a source region, a drain region and a channel formation region provided between said source region and said drain region; and
   a gate electrode provided adjacent to said channel formation region with a gate insulating film therebetween,
   wherein lattices are continuously connected to each other at grain boundary of said semiconductor film according to high resolution TEM.

8. A frequency driver according to claim 7 wherein said frequency divider is incorporated into at least one of a video camera, a still camera, a head mount display, a car navigation system, a personal computer, a portable information terminal, a system display, a mobile computer and a portable telephone.

9. An oscillator for a source line driver comprising:
   a semiconductor film provided over a silicon wafer and comprising a source region, a drain region and a channel formation region provided between said source region and said drain region; and
   a gate electrode provided adjacent to said channel formation region with a gate insulating film therebetween,
   wherein lattices are continuously connected to each other at grain boundary of said semiconductor film according to high resolution TEM.

10. An oscillator for a source line driver according to claim 9 wherein said oscillator is incorporated into at least one of a video camera, a still camera, a head mount display, a car navigation system, a personal computer, a portable information terminal, a system display, a mobile computer and a portable telephone.

11. An oscillator for a gate line driver comprising:
   a semiconductor film provided over a silicon wafer and comprising a source region, a drain region and a channel formation region provided between said source region and said drain region; and
   a gate electrode provided adjacent to said channel formation region with a gate insulating film therebetween,
   wherein lattices are continuously connected to each other at grain boundary of said semiconductor film according to high resolution TEM.

12. An oscillator for a gate line driver according to claim 11 wherein said oscillator is incorporated into at least one of a video camera, a still camera, a head mount display, a car navigation system, a personal computer, a portable information terminal, a system display, a mobile computer and a portable telephone.

13. A digital-to-analog converter comprising:
   a semiconductor film provided over a silicon wafer and comprising a source region, a drain region and a channel formation region provided between said source region and said drain region; and
   a gate electrode provided adjacent to said channel formation region with a gate insulating film therebetween,
   wherein lattices are continuously connected to each other at grain boundary of said semiconductor film according to high resolution TEM.

14. A digital-to-analog converter according to claim 13 wherein said digital-to-analog converter is incorporated into at least one of a video camera, a still camera, a head mount display, a car navigation system, a personal computer, a portable information terminal, a system display, a mobile computer and a portable telephone.

15. A pixel matrix circuit comprising:
   a semiconductor film provided over a silicon wafer and comprising a source region, a drain region and a channel formation region provided between said source region and said drain region; and
   a gate electrode provided adjacent to said channel formation region with a gate insulating film therebetween,
   wherein lattices are continuously connected to each other at grain boundary of said semiconductor film according to high resolution TEM.

16. A pixel matrix circuit according to claim 15 wherein said pixel matrix circuit is incorporated into at least one of a video camera, a still camera, a head mount display, a car navigation system, a personal computer, a portable information terminal, a system display, a mobile computer and a portable telephone.

17. A source line driver circuit comprising:
   a semiconductor film provided over a silicon wafer and comprising a source region, a drain region and a channel formation region provided between said source region and said drain region; and
   a gate electrode provided adjacent to said channel formation region with a gate insulating film therebetween,
   wherein lattices are continuously connected to each other at grain boundary of said semiconductor film according to high resolution TEM.

18. A source line driver circuit according to claim 17 wherein said source line driver circuit is incorporated into at least one of a video camera, a still camera, a head mount display, a car navigation system, a personal computer, a portable information terminal, a system display, a mobile computer and a portable telephone.

19. A gate line driver circuit comprising:
   a semiconductor film provided over a silicon wafer and comprising a source region, a drain region and a channel formation region provided between said source region and said drain region; and
   a gate electrode provided adjacent to said channel formation region with a gate insulating film therebetween,
   wherein lattices are continuously connected to each other at grain boundary of said semiconductor film according to high resolution TEM.

20. A gate line driver circuit according to claim 19 wherein said gate line driver circuit is incorporated into at least one of a video camera, a still camera, a head mount display, a car navigation system, a personal computer, a portable information terminal, a system display, a mobile computer and a portable telephone.

* * * * *

UNITED STATES PATENT AND TRADEMARK OFFICE
CERTIFICATE OF CORRECTION

PATENT NO.    : 6,730,932 B2  
DATED         : May 4, 2004  
INVENTOR(S)   : Shunpei Yamazaki and Hisashi Ohtani It is certified that error appears in the above-identified patent and that said Letters Patent is hereby corrected as shown below:

Title page,
Item [54], Title, please replace "SEMICONDUCTOR DEVICE AND METHOD OF MANUFACTURING THE SAME" with -- SEMICONDUCTOR DEVICE FORMING A PIXEL MATRIX CIRCUIT --.

Signed and Sealed this

Thirty-first Day of August, 2004

JON W. DUDAS  
*Director of the United States Patent and Trademark Office*